US012648490B2

(12) United States Patent
Kim et al.

(10) Patent No.: US 12,648,490 B2
(45) Date of Patent: Jun. 2, 2026

(54) SEMICONDUCTOR PACKAGE

(71) Applicant: SAMSUNG ELECTRONICS CO., LTD., Suwon-si (KR)

(72) Inventors: Youngdeuk Kim, Suwon-si (KR); Heejung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 18/218,673

(22) Filed: Jul. 6, 2023

(65) Prior Publication Data

US 2024/0079393 A1 Mar. 7, 2024

(30) Foreign Application Priority Data

Sep. 7, 2022 (KR) ........................ 10-2022-0113787

(51) Int. Cl.

| | |
|---|---|
| *H10W 90/00* | (2026.01) |
| *H10B 80/00* | (2026.01) |
| *H10W 40/22* | (2026.01) |
| *H10W 70/60* | (2026.01) |
| *H10W 70/65* | (2026.01) |
| *H10W 70/655* | (2026.01) |

(Continued)

(52) U.S. Cl.
CPC ............ *H10W 90/00* (2026.01); *H10B 80/00* (2023.02); *H10W 40/22* (2026.01); *H10W 70/611* (2026.01); *H10W 70/65* (2026.01); *H10W 70/685* (2026.01); *H10W 74/121* (2026.01); *H10W 70/655* (2026.01); *H10W 70/682* (2026.01); *H10W 72/877* (2026.01);

*H10W 74/15* (2026.01); *H10W 90/722* (2026.01); *H10W 90/724* (2026.01); *H10W 90/732* (2026.01); *H10W 90/734* (2026.01)

(58) Field of Classification Search
CPC ..................................................... H01L 25/105
See application file for complete search history.

(56) References Cited

U.S. PATENT DOCUMENTS

| | | | |
|---|---|---|---|
| 7,781,682 B2 * | 8/2010 | Bahadur | ................. H01L 23/42 |
| | | | 257/713 |
| 8,472,190 B2 | 6/2013 | Refai-Ahmed et al. | |

(Continued)

FOREIGN PATENT DOCUMENTS

| | | |
|---|---|---|
| CN | 114334945 A | 4/2022 |
| KR | 1020150143309 A | 12/2015 |

*Primary Examiner* — William A Harriston
(74) *Attorney, Agent, or Firm* — Muir Patent Law, PLLC

(57) ABSTRACT

A semiconductor package includes a package substrate including a substrate cavity, the substrate cavity extending from an upper surface of the package substrate toward a lower surface of the package substrate, a wiring interposer attached to the package substrate, a memory semiconductor structure attached to a lower surface of the wiring interposer, at least a portion of the memory semiconductor structure art being accommodated in the substrate cavity, a logic semiconductor chip attached to an upper surface of the wiring interposer, a conductive spacer spaced apart from the logic semiconductor chip in a horizontal direction, the conductive spacer being attached to the upper surface of the wiring interposer and overlapping the memory semiconductor structure in a vertical direction, and a heat dissipation member over the logic semiconductor chip and the conductive spacer.

20 Claims, 17 Drawing Sheets

(51) Int. Cl.
| | |
|---|---|
| *H10W 70/68* | (2026.01) |
| *H10W 70/685* | (2026.01) |
| *H10W 72/00* | (2026.01) |
| *H10W 74/10* | (2026.01) |
| *H10W 74/15* | (2026.01) |

(56) References Cited

U.S. PATENT DOCUMENTS

| | | | |
|---|---|---|---|
| 8,604,603 | B2 | 12/2013 | Lau et al. |
| 9,076,754 | B2 * | 7/2015 | Hung ..................... H01L 23/42 |
| 9,269,694 | B2 * | 2/2016 | Chen .................... H01L 23/367 |
| 9,466,561 | B2 * | 10/2016 | Li ..................... H01L 23/49827 |
| 11,088,109 | B2 * | 8/2021 | Lin ..................... H01L 23/3677 |
| 11,152,333 | B2 * | 10/2021 | Lunde ..................... H01L 23/13 |
| 11,217,503 | B2 | 1/2022 | Jung et al. |
| 2006/0065972 | A1 * | 3/2006 | Khan .................. H01L 23/3128 |
| | | | 257/E23.079 |
| 2010/0213600 | A1 * | 8/2010 | Lau ..................... H01L 23/5384 |
| | | | 438/122 |
| 2012/0187578 | A1 * | 7/2012 | Li ..................... H01L 23/49827 |
| | | | 257/778 |
| 2014/0151891 | A1 | 6/2014 | Takano et al. |
| 2015/0162307 | A1 * | 6/2015 | Chen .................... H01L 23/367 |
| | | | 438/107 |
| 2017/0133323 | A1 | 5/2017 | Ho et al. |
| 2017/0179078 | A1 | 6/2017 | Jung et al. |
| 2020/0161275 | A1 * | 5/2020 | Lin ..................... H01L 23/5384 |
| 2021/0296278 | A1 * | 9/2021 | Yen ......................... H01L 24/35 |
| 2022/0173072 | A1 * | 6/2022 | Hong ................. H01L 23/5384 |
| 2024/0038617 | A1 * | 2/2024 | Hung ................. H01L 25/0657 |
| 2024/0105530 | A1 * | 3/2024 | Hung ..................... H01L 23/16 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0113787, filed on Sep. 7, 2022, in the Korean Intellectual Property Office, the disclosure of which is incorporated by reference herein in its entirety.

BACKGROUND

1. Field

Embodiments relate to a semiconductor package, and more particularly, to a semiconductor package including a plurality of semiconductor chips.

2. Description of the Related Art

In accordance with the rapid development of the electronics industry and the needs of users, electronic products have become smaller and lighter. To this end, a semiconductor package mounted on an electronic product is required to include various functions while the volume thereof is gradually reduced. Accordingly, a semiconductor package including a plurality of semiconductor chips has been developed.

SUMMARY

According to an aspect of embodiments, there is provided a semiconductor package including a package substrate including a substrate cavity extending from an upper surface to an inside, a wiring interposer attached to the package substrate, a memory semiconductor structure attached to a lower surface of the wiring interposer and having at least a part accommodated in the substrate cavity, a logic semiconductor chip attached to an upper surface of the wiring interposer, a conductive spacer spaced apart from the logic semiconductor chip in a horizontal direction, attached to the upper surface of the wiring interposer, and overlapping a part of the memory semiconductor structure in a vertical direction, and a heat dissipation member disposed over the logic semiconductor chip and the conductive spacer.

According to another aspect of embodiments, there is provided a semiconductor package including a package substrate including a substrate cavity extending from an upper surface to an inside, a wiring interposer attached to the package substrate, a memory semiconductor structure attached to a lower surface of the wiring interposer and having at least a part accommodated in the substrate cavity, a logic semiconductor chip attached to an upper surface of the wiring interposer so as not to overlap the substrate cavity in a vertical direction, a conductive spacer spaced apart from the logic semiconductor chip in a horizontal direction and attached on the upper surface of the wiring interposer so as to wholly overlap the memory semiconductor structure in the vertical direction, and a heat dissipation member disposed over the logic semiconductor chip and the conductive spacer.

According to another aspect of embodiments, there is provided a semiconductor package including a package substrate including a substrate cavity extending from an upper surface to an inside, and having the upper surface on which a plurality of upper surface substrate pads are disposed, a wiring interposer attached onto the package substrate, and including a plurality of interposer lower surface pads respectively including a plurality of interposer chip pads and a plurality of interposer substrate pads and disposed on a lower surface of the wiring interposer, a plurality of interposer upper surface pads disposed on an upper surface of the wiring interposer, and an interposer wiring layer electrically connecting the plurality of interposer lower surface pads to the plurality of interposer upper surface pads, a memory semiconductor structure attached onto a lower surface of the wiring interposer, at least partially accommodated in the substrate cavity, and including a plurality of first front surface connection pads electrically connected to the plurality of interposer chip pads and positioned at a vertical level higher than the plurality of upper surface substrate pads, a logic semiconductor chip attached onto an upper surface of the wiring interposer and including a plurality of second front surface connection pads electrically connected to the plurality of interposer upper surface pads, a conductive spacer spaced apart from the logic semiconductor chip in a horizontal direction and attached on the upper surface of the wiring interposer so as to wholly overlap at least a part of the memory semiconductor structure in a vertical direction, a heat dissipation member disposed over the logic semiconductor chip and the conductive spacer, a plurality of interposer connection terminals disposed between the plurality of interposer substrate pads and the plurality of upper surface substrate pads, and a filling under-fill layer filling the substrate cavity, surrounding the plurality of interposer connection terminals, and filling a space between the package substrate and the wiring interposer.

BRIEF DESCRIPTION OF THE DRAWINGS

Features will become apparent to those of skill in the art by describing in detail exemplary embodiments with reference to the attached drawings, in which:

FIGS. 2A to 2J are cross-sectional views illustrating stages in a manufacturing method of a semiconductor package according to some embodiments;

DETAILED DESCRIPTION

Figure 1:
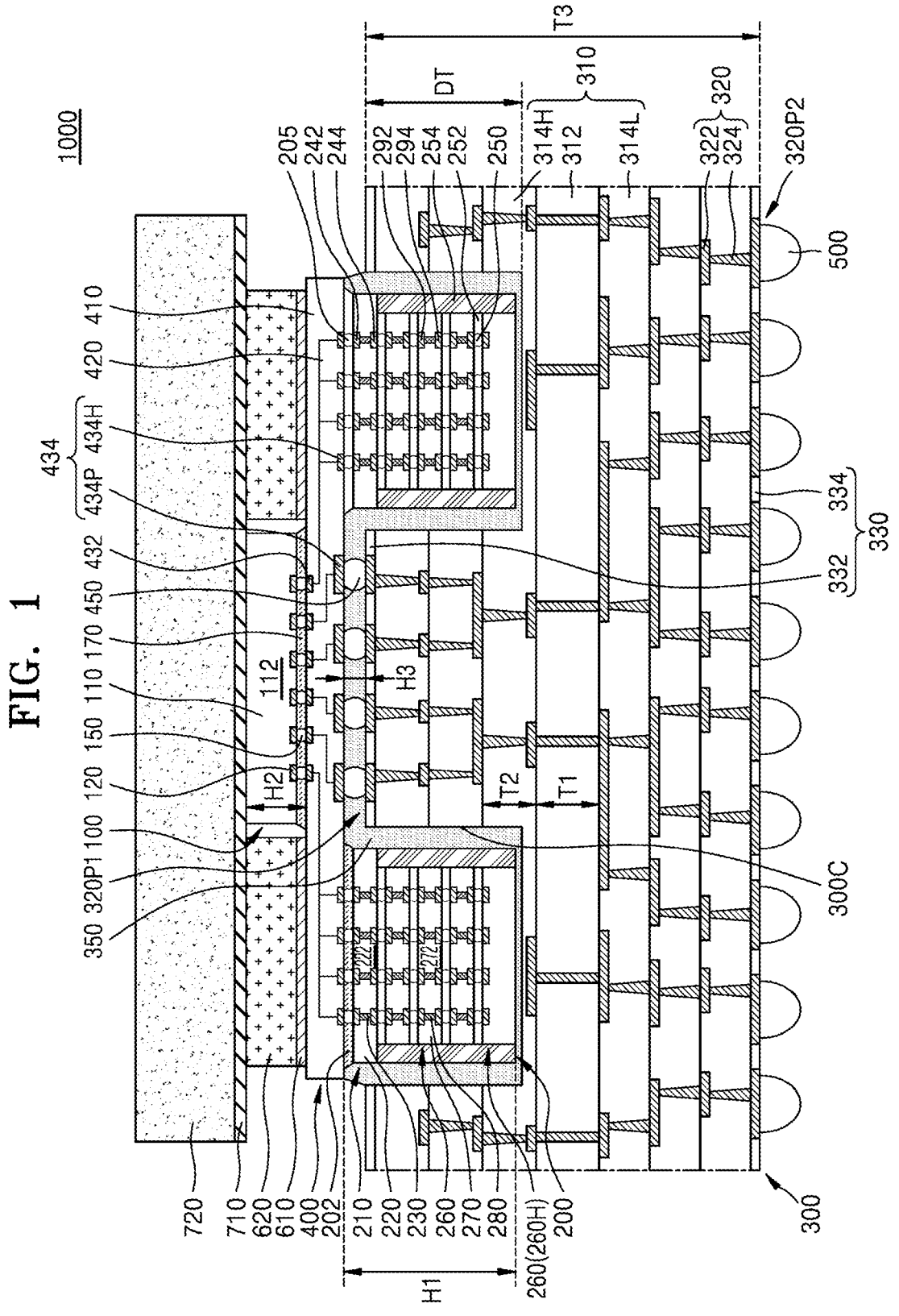
FIG. 1 is a cross-sectional view of a semiconductor package according to some embodiments.

FIG. 1 is a cross-sectional view of a semiconductor package according to some embodiments.

Referring to FIG. 1, a semiconductor package 1000 may include a package substrate 300, a wiring interposer 400 disposed on the package substrate 300, at least one logic semiconductor chip 100 attached to an upper surface of the wiring interposer 400, and at least one memory semiconductor structure 200 attached to a lower surface of the wiring interposer 400. In some embodiments, the at least the logic semiconductor chip 100 and the at least one memory semiconductor structure 200 may be respectively attached to upper and lower surfaces of the wiring interposer 400 so as not to overlap each other in a vertical direction, e.g., the logic semiconductor chip 100 and the memory semiconductor structure 200 may have a non-overlapping relationship. Unless otherwise specified in the present specification, an upper surface refers to a surface facing upward in the drawing, a lower surface refers to a surface facing downward in the drawing (e.g., facing a bottom of the package substrate 300), a front surface of a chip refers to a surface adjacent to an active surface of a substrate included in the chip, and a rear surface of the chip refers to an inactive surface of the substrate included in the chip.

In some embodiments, the semiconductor package 1000 may include a plurality of logic semiconductor chips 100. The plurality of logic semiconductor chips 100 may be disposed on the upper surface of the wiring interposer 400 so as to be adjacent to each other but spaced apart from each other in a horizontal direction. In some embodiments, the semiconductor package 1000 may include a plurality of memory semiconductor structures 200. The plurality of memory semiconductor structures 200 may be disposed on the lower surface of the wiring interposer 400 so as to be spaced apart from each other in the horizontal direction.

FIG. 1 shows that the semiconductor package 1000 includes one logic semiconductor chip 100 and two memory semiconductor structures 200, but this is an example and embodiments are not limited thereto. For example, the semiconductor package 1000 may include two or more logic semiconductor chips 100, and may include four, six, eight, or ten or more memory semiconductor structures 200.

The at least one memory semiconductor structure 200 may include a memory device. For example, the at least one memory semiconductor structure 200 may include a dynamic random access memory (DRAM) semiconductor chip, a NAND flash memory semiconductor chip, or a V-NAND flash memory semiconductor chip. In some embodiments, the at least one memory semiconductor structure 200 may be a stacked structure including a first semiconductor chip 210 and a plurality of second semiconductor chips 260. FIG. 1 shows that the at least one memory semiconductor structure 200 includes one first semiconductor chip 210 and four second semiconductor chips 260, but embodiments are not limited thereto. For example, the memory semiconductor structure 200 may include two or more second semiconductor chips 260. In some embodiments, one memory semiconductor structure 200 may include a four multiple of second semiconductor chips 260. The plurality of second semiconductor chips 260 may be sequentially stacked on the first semiconductor chip 210 in a vertical direction, e.g., along a direction normal to a bottom of the package substrate 300. The first semiconductor chip 210 and each of the plurality of second semiconductor chips 260 may be sequentially stacked on the lower surface of the wiring interposer 400 with the active surface facing the upper side, i.e., the active surface facing the wiring interposer 400. That is, the at least one memory semiconductor structure 200 may be attached onto the lower surface of the wiring interposer 400 so that the first semiconductor chip 210 is more adjacent to the wiring interposer 400 than the plurality of second semiconductor chips 260.

In some embodiments, the first semiconductor chip 210 may not include a memory cell. For example, the first semiconductor chip 210 may include a serial-parallel conversion circuit, a test logic circuit, e.g., a design for test (DFT), Joint Test Action Group (JTAG), and a memory built-in self-test (MBIST), and a signal interface circuit, e.g., PHY. The plurality of second semiconductor chips 260 may include memory cells. For example, the first semiconductor chip 210 may be a buffer chip for controlling the plurality of second semiconductor chips 260.

In some embodiments, the first semiconductor chip 210 may be a buffer chip for controlling high bandwidth memory (HBM) DRAM, and the plurality of second semiconductor chips 260 may be memory cell chips including cells of the HBM DRAM controlled by the first semiconductor chip 210. The first semiconductor chip 210 may be called a buffer chip or a master chip, and the second semiconductor chip 260 may be called a core chip, a memory cell chip, or a slave chip. For example, the memory semiconductor structure 200 including the first semiconductor chip 210 and the plurality of second semiconductor chips 260 sequentially stacked on the first semiconductor chip 210 may be the HBM DRAM.

The first semiconductor chip 210 may include a first substrate 220, a plurality of first through electrodes 230, a plurality of first front surface connection pads 242, and a plurality of first rear surface connection pads 244. The second semiconductor chip 260 may include a second substrate 270, a plurality of second through electrodes 280, a plurality of second front surface connection pads 292, and a plurality of second rear surface connection pads 294.

For example, the first substrate 220 and the second substrate 270 may include silicon (Si). In another example, the first substrate 220 and the second substrate 270 may include a semiconductor device, e.g., germanium (Ge), or a compound semiconductor, e.g., silicon carbide (SiC), gallium arsenide (GaAs), indium arsenide (InAs), and indium phosphide (InP). The first substrate 220 and the second substrate 270 may each have an active surface and an inactive surface opposite to the active surface. The first substrate 220 and the second substrate 270 may each include various types of individual devices on the active surface. For example, the individual devices may include a metal-oxide-semiconductor field effect transistor (MOSFET), e.g., a complementary metal-insulator-semiconductor (CMOS) transistor, an image sensor, e.g., system large scale integration (LSI), a CMOS imaging sensor (CIS), etc., a micro-electro-mechanical system (MEMS), an active device, a passive device, etc. The active surface and the inactive surface of the first substrate 220 may be respectively referred to as a first active surface and a first inactive surface, and the active surface and the inactive surface of the second substrate 270 may be respectively referred to as a second active surface and a second inactive surface.

The first semiconductor chip 210 and the second semiconductor chip 260 may respectively include a first semiconductor device 222 and a second semiconductor device 272 included in the plurality of individual devices. The first semiconductor device 222 may be disposed on the first active surface of the first substrate 220, the plurality of first front surface connection pads 242 and the plurality of first rear surface connection pads 244 may be respectively disposed on the first active surface and the first inactive surface of the first substrate 220, and the plurality of first through electrodes 230 may vertically penetrate at least a part of the first substrate 220 and may electrically connect the plurality of first front surface connection pads 242 to the plurality of first rear surface connection pads 244.

The second semiconductor device 272 may be formed on the second active surface of the second substrate 270, the plurality of second front surface connection pads 292 and the plurality of second rear surface connection pads 294 may be respectively disposed on the second active surface and the second inactive surface of the second substrate 270, and the plurality of second through electrodes 280 may vertically penetrate at least a part of the second substrate 270 and may electrically connect the plurality of second front surface connection pads 292 to the plurality of second rear surface connection pads 294. The plurality of second through electrodes 280 may be electrically connected to the plurality of first through electrodes 230 respectively.

A plurality of chip connection terminals 250 may be attached to the plurality of second front surface connection pads 292 of the plurality of second semiconductor chips 260. The plurality of chip connection terminals 250 may be disposed between the plurality of first rear surface connection pads 244 of the first semiconductor chip 210 and the plurality of second front surface connection pads 292 of the lowermost second semiconductor chip 260 among the plurality of second semiconductor chips 260 and between the plurality of second front surface connection pads 292 of the remaining second semiconductor chips 260 among the plurality of second semiconductor chips 260 and the plurality of second rear surface connection pads 294 of the other second semiconductor chips 260 therebelow and may electrically connect the first semiconductor chip 210 to the plurality of second semiconductor chips 260. Each of the plurality of chip connection terminals 250 may be a bump or a solder ball.

In some embodiments, among the plurality of second semiconductor chips 260, a lowermost second semiconductor chip 260H positioned farthest from the first semiconductor chip 210 may not include the second rear surface connection pad 294 and the second through electrode 280. In some embodiments, among the plurality of second semiconductor chips 260, the thickness of the lowermost second semiconductor chip 260H positioned farthest from the first semiconductor chip 210 may have a value greater than those of thicknesses of the remaining second semiconductor chips 260.

An insulating adhesive layer 252 may be disposed between the first semiconductor chip 210 and each of the plurality of second semiconductor chips 260. The insulating adhesive layer 252 may be attached to the lower surface of each of the plurality of second semiconductor chips 260 and may attach each of the plurality of second semiconductor chips 260 onto a lower structure, e.g., the first semiconductor chip 210 or the other second semiconductor chip 260 positioned on the lower side among the plurality of second semiconductor chips 260. The insulating adhesive layer 252 may include, e.g., a non-conductive film (NCF), a non-conductive paste (NCP), an insulating polymer, or an epoxy resin. The insulating adhesive layer 252 may cover the plurality of chip connection terminals 250 and fill between the first semiconductor chip 210 and each of the plurality of second semiconductor chips 260.

The horizontal width and area of the first semiconductor chip 210 may have greater values than the horizontal width and area of each of the plurality of second semiconductor chips 260. For example, the plurality of second semiconductor chips 260 may all overlap the first semiconductor chip 210 in the vertical direction. In some embodiments, the plurality of second semiconductor chips 260 may all overlap each other in the vertical direction.

The memory semiconductor structure 200 may further include a chip molding layer 254 surrounding the plurality of second semiconductor chips 260 and the plurality of insulating adhesive layers 252 on the lower surface of the first semiconductor chip 210, i.e., the first inactive surface of the first substrate 220. The chip molding layer 254 may cover the lower surface of the first semiconductor chip 210, i.e., the first inactive surface of the first substrate 212, and may cover side surfaces of the plurality of second semiconductor chips 260. In some embodiments, the side surface of the first semiconductor chip 210 and the side surface of the chip molding layer 254 corresponding to each other may be aligned in the vertical direction and may be coplanar. In some embodiments, the chip molding layer 254 may cover the side surfaces of the plurality of second semiconductor chips 260, and may not cover and expose the lower surface of the lowermost second semiconductor chip 260H, i.e., the second inactive surface of the second substrate 270 of the lowermost second semiconductor chip 260H. The chip molding layer 254 may be made of, e.g., epoxy molding compound (EMC).

The at least one logic semiconductor chip 100 may include a third substrate 110 including an active surface and an inactive surface opposite to each other, a third semiconductor device 112 formed on the active surface of the third substrate 110, and a plurality of third front surface connection pads 120 disposed on the lower surface of the logic semiconductor chip 100. The active surface and the inactive surface of the third substrate 110 may be respectively referred to as a third active surface and a third inactive surface. For example, the logic semiconductor chip 100 may have a thickness of about 50 μm to about 150 μm.

In some embodiments, in the logic semiconductor chip 100, the active surface of the third substrate 110 may have a face down arrangement facing the wiring interposer 400, and may be disposed on the upper surface of the wiring interposer 400.

For example, the third substrate 110 may include a semiconductor material, e.g., silicon (Si) or germanium (Ge). In another example, the third substrate 110 may include a compound semiconductor material, e.g., silicon carbide (SiC), gallium arsenide (GaAs), indium arsenide (InAs), or indium phosphide (InP). The third substrate 110 may include a conductive region, e.g., a well doped with impurities. The third substrate 110 may have various device isolation structures, e.g., a shallow trench isolation (STI) structure.

The third semiconductor device 112 including various types of individual devices may be formed on the active surface of the third substrate 110. For example, the plurality of individual devices may include a metal-oxide-semiconductor field effect transistor (MOSFET), e.g., a complementary metal-insulator-semiconductor (CMOS) transistor, etc., an image sensor, e.g., system large scale integration (LSI), a CMOS imaging sensor (CIS), etc., a micro-electro-mechanical system (MEMS), an active device, a passive device, etc. Each of the plurality of individual devices may be electrically connected to the conductive region of the third substrate 110. The third semiconductor device 112 may further include a conductive wiring or a conductive plug electrically connecting at least two of the plurality of individual devices or each of the plurality of individual devices to the conductive region of the third substrate 110. In addition, the plurality of individual devices may be electrically separated from other neighboring individual devices by an insulating film.

The third semiconductor device 112 included in the logic semiconductor chip 100 may include a logic device. For example, the logic semiconductor chip 100 may be a central processing unit (CPU) chip, a graphics processing unit (GPU) chip, or an application processor (AP) chip.

A first height H1 from the lower surface of the wiring interposer 400 to the lower surface of the at least one memory semiconductor structure 200 may have a greater value than that of a second height H2 from the upper surface of the wiring interposer 400 to the upper surface of the at least one logic semiconductor chip 100. For example, the first height H1 may be about 500 μm to about 1000 μm, and the second height H2 may be about 100 μm to about 300 μm. In some embodiments, the first height H1 may be three or more times the second height H2.

The package substrate 300 may be a printed circuit board. For example, the package substrate 300 may be a double-sided printed circuit board or a multi-layer printed circuit board. When the package substrate 300 is a multi-layer printed circuit board, wiring layers may be respectively disposed on a lower surface, an upper surface, and an inside of the package substrate 300. The package substrate 300 may include a plurality of stacked base layers 310 and a substrate wiring layer 320. The wiring layer means where a part of the substrate wiring layer 320 is disposed at the same vertical level. A wiring layer may be disposed on each of the upper and lower surfaces of the package substrate 300 and between two adjacent base layers 310 among the plurality of base layers 310.

Each of the plurality of base layers 310 may be made of at least one of phenol resin, epoxy resin, or polyimide. For example, each of the plurality of base layers 310 may include at least one of Frame Retardant 4 (FR4), tetrafunctional epoxy, polyphenylene ether, epoxy/polyphenylene oxide, bismaleimide triazine (BT), thermount, cyanate ester, polyimide, and liquid crystal polymer.

The plurality of base layers 310 may include a core layer 312 and at least one prepreg layer stacked on upper and lower surfaces of the core layer 312, respectively. For example, the plurality of base layers 310 may include the core layer 312, at least one upper prepreg layer 314H stacked on an upper surface of the core layer 312, and at least one lower prepreg layer 314L stacked on the lower surface of the core layer 312. Each of the core layer 312, the upper prepreg layer 314H, and the lower prepreg layer 314L may be made of the same material. FIG. 1 shows that three upper prepreg layers 314H are sequentially stacked on the upper surface of the core layer 312, and three lower prepreg layers 314L are sequentially stacked on the lower surface of the core layer 312, but this is an example and embodiments are not limited thereto. For example, one upper prepreg layer 314H may be stacked, or two or four or more upper prepreg layers 314H may be sequentially stacked on the upper surface of the core layer 312, and one lower prepreg layer 314L may be stacked, or two or four or more lower prepreg layers 314L may be sequentially stacked on the lower surface of the core layer 312.

The core layer 312 may have a first thickness T1, and each of the prepreg layers, i.e., each of the upper prepreg layer 314H and the lower prepreg layer 314L, may have a thickness T2 less than the first thickness T1. The second thickness T2 may be about 50 μm to about 200 μm, and the first thickness T1 may be about 70 μm to about 1500 μm.

The substrate wiring layer 320 may include a plurality of wiring patterns 322 disposed on upper and lower surfaces of each of the plurality of base layers 310, and a plurality of wiring vias 324 penetrating the at least one base layer 310 among the plurality of base layers 310 and electrically connecting between the wiring patterns 322 disposed on respective wiring layers positioned at different vertical levels. The wiring patterns 322 positioned at the same vertical level may form one wiring layer.

Each of the plurality of wiring patterns 322 may be made of, e.g., electrolytically deposited (ED) copper foil, rolledannealed (RA) copper foil, stainless steel foil, aluminum foil, ultra-thin copper foils, sputtered copper, copper alloys, etc.

The plurality of wiring patterns 322 may include a plurality of upper surface substrate pads 320P1 and a plurality of lower surface substrate pads 320P2 disposed on the upper and lower surfaces of the package substrate 300. For example, the plurality of upper surface substrate pads 320P1 may be disposed on the upper surface of the upper prepreg layer 314H which is the uppermost base layer 310 among the plurality of base layers 310, and the plurality of lower surface substrate pads 320P2 may be disposed on the lower surface of the lower prepreg layer 314L which is the lowermost base layer 310 among the plurality of base layers 310.

In some embodiments, the package substrate 300 may include a solder resist layer 330 disposed on upper and lower surfaces thereof. The solder resist layer 330 may include an upper surface solder resist layer 332 disposed on the upper surface of the package substrate 300 and a lower surface solder resist layer 334 disposed on the lower surface of the package substrate 300. At least a part of each of the plurality of upper surface substrate pads 320P1 may be exposed on the upper surface of the package substrate 300 by not being covered by the upper surface solder resist layer 332. At least a part of each of the plurality of lower surface substrate pads 320P2 may be exposed on the lower surface of the package substrate 300 by not being covered by the lower surface solder resist layer 334.

FIG. 1 shows that only the plurality of upper surface substrate pads 320P1 are disposed on the upper surface of the uppermost base layer 310 among the plurality of base layers 310, and the plurality of lower surface substrate pads 320P2 are disposed on the lower surface of the lowermost base layer 310, but embodiments are not limited thereto. For example, the wiring pattern 322 covered by the upper surface solder resist layer 332 may be disposed on the upper surface of the uppermost base layer 310 among the plurality of base layers 310, and the wiring pattern 322 covered by the lower surface solder resist layer 334 may be disposed on the lower surface of the lowermost base layer 310.

In some embodiments, the plurality of upper surface substrate pads 320P1 and the plurality of lower surface substrate pads 320P2 may be buried in any one of the plurality of base layers 310. For example, upper surfaces of the plurality of upper surface substrate pads 320P1 and the upper surface of the upper prepreg layer 314H which is the uppermost base layer 310 among the plurality of base layers 310 may be positioned at the same vertical level and may be coplanar, and lower surfaces of the plurality of lower surface substrate pads 320P2 and the lower surface of the lower prepreg layer 314L which is the lowermost base layer 310 among the plurality of base layers 310 may be positioned at the same vertical level and may be coplanar.

A plurality of external connection terminals 500 may be respectively attached to the plurality of lower surface substrate pads 320P2. For example, the plurality of external connection terminals 500 may be respectively attached to lower surfaces of the plurality of lower surface substrate pads 320P2. In some embodiments, each of the plurality of lower surface substrate pads 320P2 may have a rectangular shape or a circular shape in a plan view, and may have a maximum horizontal width of about 50 μm to about 200 μm. The plurality of external connection terminals 500 may electrically connect between the semiconductor package 1000 and an external device. In some embodiments, each of the plurality of external connection terminals 500 may be a conductive bump or a solder ball.

Unlike the wiring patterns 322, a metal layer may be further formed on each of the plurality of upper surface substrate pads 320P1 and the plurality of lower surface substrate pads 320P2 of the plurality of wiring patterns 322. For example, the metal layer may be disposed on the upper surface of each of the plurality of upper surface substrate pads 320P1 and the lower surface of each of the plurality of lower surface substrate pads 320P2. The metal layer may be formed to improve adhesion and reduce contact resistance of each of the plurality of upper surface substrate pads 320P1 and the plurality of lower surface substrate pads 320P2. For example, the metal layer may be formed by Hot Air Solder Leveling (H.A.S.L.), Ni/Au plating, etc.

Each of the plurality of wiring vias 324 may electrically connect between two wiring patterns 322 disposed on different layers. Each of the plurality of wiring vias 324 may penetrate the at least one base layer 310. For example, the plurality of wiring vias 324 may electrically connect the plurality of upper surface substrate pads 320P1 and the plurality of lower surface substrate pads 320P2 to each other, respectively. For example, the plurality of upper surface substrate pads 320P1 and the plurality of lower surface substrate pads 320P2 may be electrically connected to each other through the at least one wiring pattern 322 and the at least two wiring vias 324 disposed between the two adjacent base layers 310 among the plurality of base layers 310. The plurality of wiring vias 324 may be made of, e.g., copper, nickel, stainless steel, or beryllium copper.

The package substrate 300 may have at least one substrate cavity 300C extending from the upper surface thereof to the inside, e.g., the cavity 300C extends from the upper surface of the package substrate 300 toward a lower surface of the package substrate 300. The at least one substrate cavity 300C may extend from the upper surface of the package substrate 300 toward the lower surface of the package substrate 300. In some embodiments, the substrate cavity 300C may extend from the upper surface of the package substrate 300 to the inside of the package substrate 300, but may not extend to the upper surface of the core layer 312. At least one substrate cavity 300C may have a rectangular shape in a plan view. In some embodiments, the at least one substrate cavity 300C may not overlap the at least one logic semiconductor chip 100 in the vertical direction.

The substrate cavity 300C may penetrate a part of the upper prepreg layer 314H. For example, a part of the upper prepreg layer 314H may be exposed to the bottom surface of the substrate cavity 300C. In some embodiments, when the package substrate 300 includes the plurality of upper prepreg layers 314H stacked on the upper surface of the core layer 312, the substrate cavity 300C may penetrate from the upper surface of the at least one upper prepreg layer 314H to the lower surface among the plurality of upper prepreg layers 314H from the upper side thereof and may not penetrate from the upper surface of the at least one upper prepreg layer 314H to the lower surface from the lower side thereof. For example, the bottom surface of the substrate cavity 300C may be positioned at a higher vertical level than the upper surface of the core layer 312.

The substrate cavity 300C may have a cavity depth DT, e.g., as measured, between the upper surface of the package substrate 300 and the bottom surface of the substrate cavity 300C. The package substrate 300 may have a third thickness T3 greater than each of the first thickness T1 and the second thickness T2. The third thickness T3 may be about 1.5 μm to about 5 μm. The cavity depth DT may have a value less than ½ of the third thickness T3. When the package substrate 300 includes a plurality of substrate cavities 300C, the plurality of substrate cavities 300C may be spaced apart from each other. The cavity depth DT may have a value equal to or less than the first height H1. For example, the cavity depth DT may be about 500 nm to about 800 nm.

FIG. 1 shows that the substrate cavity 300C completely penetrates two upper prepreg layers 314H on the upper side among the three upper prepreg layers 314H included in the package substrate 300 and penetrates only a part of the upper side of one upper prepreg layer 314H on the lower side, but this is an example and embodiments are not limited thereto. The substrate cavity 300C may be formed to have the cavity depth DT equal to or less than the first height H1, in correspondence to the first height H1. For example, the substrate cavity 300C may penetrate only a part of the upper side of one upper prepreg layer 314H on the upper side, may completely penetrate one or two upper prepreg layers 314H on the upper side but may not penetrate a part of one or two upper prepreg layers 314H on the lower side, or may completely penetrate one upper prepreg layer 314H on the upper side and penetrate only a part of the upper side of one upper prepreg layer 314H therebelow but may not penetrate a part of one upper prepreg layer 314H on the lower side.

The wiring interposer 400 may be used to implement a vertical connection terminal for interconnecting the at least one logic semiconductor chip 100 and the at least one memory semiconductor structure 200 with the package substrate 300 in a fine pitch type. The wiring interposer 400 includes an interposer base layer 410, a plurality of interposer upper surface pads 432 disposed on the upper surface of the interposer base layer 410, a plurality of interposer lower surface pads 434 disposed on the lower surface of the interposer base layer 410, and an interposer wiring layer 420 electrically connecting between the plurality of interposer upper surface pads 432 and the plurality of interposer lower surface pads 434.

The plurality of interposer lower surface pads 434 may respectively include a plurality of interposer chip pads 434H and a plurality of interposer substrate pads 434P. For example, the horizontal width of each of the plurality of interposer substrate pads 434P may be greater than the horizontal width of each of the plurality of interposer chip pads 434H. In some embodiments, the plurality of interposer substrate pads 434P may be disposed on a central portion of the lower surface of the wiring interposer 400, and the plurality of interposer chip pads 434H may be disposed on a peripheral portion of the lower surface of the wiring interposer 400, i.e., on the periphery of the plurality of interposer substrate pads 434P. At least some of the plurality of interposer substrate pads 434P may overlap the at least one logic semiconductor chip 100 in the vertical direction, and all of the plurality of interposer chip pads 434H may overlap the at least one memory semiconductor structure 200 in the vertical direction.

A plurality of first interposer connection terminals 205 may be respectively attached to the plurality of interposer chip pads 434H. A plurality of second interposer connection terminals 150 may be attached to the plurality of interposer upper surface pads 432. A plurality of third interposer connection terminals 450 may be respectively attached to the plurality of interposer substrate pads 434P. The plurality of first interposer connection terminals 205 may electrically connect the at least one memory semiconductor structure 200 to the wiring interposer 400. The plurality of second interposer connection terminals 150 may electrically connect the at least one logic semiconductor chip 100 to the wiring interposer 400. The plurality of third interposer connection terminals 450 may electrically connect the wiring interposer 400 to the package substrate 300. Each of the plurality of first interposer connection terminals 205, the plurality of second interposer connection terminals 150, and the plurality of third interposer connection terminals 450 may be a conductive bump or a solder ball. Each of the plurality of third interposer connection terminals 450 may have a third height H3. The third height H3 may have a smaller value than each of the first height H1 and the second height H2. The third height H3 may be, e.g., about 10 μm to about 50 μm. The height of each of the plurality of first interposer connection terminals 205 and the plurality of second interposer connection terminals 150 may be less than the third height H3.

The upper surface of the package substrate 300 may be positioned at a vertical level lower than the upper surface of the memory semiconductor structure 200. For example, the upper surface of each of the plurality of upper surface substrate pads 320P1 included in the package substrate 300 and the lower surface of each of the plurality of third interposer connection terminals 450 connected thereto may be positioned at a vertical level lower than the upper surface of each of the plurality of first front surface connection pads 242.

The interposer base layer 410 may include, e.g., a semiconductor material, glass, ceramic, or plastic. For example, the interposer base layer 410 may include silicon (Si). In some embodiments, the wiring interposer 400 may be a Si interposer in which the interposer base layer 410 is formed from a silicon semiconductor substrate. In some embodiments, the wiring interposer 400 may be a redistribution interposer formed by a redistribution process.

At least a part of the interposer wiring layer 420 may be penetration electrodes penetrating at least a part of the interposer base layer 410. Each of the penetration electrodes may include a conductive plug penetrating the interposer base layer 410 and a conductive barrier layer surrounding the conductive plug. The conductive plug may include, e.g., Cu or W, and the conductive barrier layer may include, e.g., a metal or a conductive metal nitride. The conductive plug may have a cylindrical shape, and the conductive barrier layer may have a cylindrical shape surrounding the sidewall of the conductive plug. A plurality of via insulation layers may be disposed between the interposer base layer 410 and the through electrodes to surround sidewalls of the through electrodes. The plurality of via insulating layers may prevent direct contact between the interposer base layer 410 and the through electrodes. The via insulating layer may include, e.g., an oxide layer, a nitride layer, a carbide layer, a polymer, or a combination thereof.

FIG. 1 shows that the interposer wiring layer 420 is disposed in the interposer base layer 410, but this is an example and embodiments are not limited thereto. For example, a part of the interposer wiring layer 420 may be redistribution conductive layers disposed on the upper surface and/or the lower surface of the interposer base layer 410 and formed through a redistribution process, or may be wiring layers formed through a back end of line (BEOL) process.

In some embodiments, when a part of the interposer wiring layer 420 includes redistribution conductive lines, the interposer wiring layer 420 may include a metal, e.g., copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but is not limited thereto. In some embodiments, the interposer wiring layer 420 may be formed by depositing a metal or a metal alloy on a seed layer including, e.g., titanium, titanium nitride, or titanium tungsten. The wiring interposer 400 may include an interposer wiring insulating layer surrounding the redistribution conductive lines. The interposer wiring insulating layer may be made of, e.g., photo imagable dielectric (PID) or photosensitive polyimide (PSPI).

In some embodiments, when a part of the interposer wiring layer 420 includes wiring layers formed through the BEOL process, the wiring layers may include a metal material, e.g., copper (Cu), aluminum (Al), and tungsten (W). The wiring interposer 400 may include an interposer wiring insulating layer surrounding the wiring layers. The interposer wiring insulating layer may include, e.g., a high density plasma (HDP) oxide layer, a TEOS oxide layer, Tonen SilaZene (TOSZ), Spin On Glass (SOZ), Undoped Silica Glass (USG), a low-k dielectric layer, etc.

The plurality of first interposer connection terminals 205 may be disposed between the plurality of interposer chip pads 434H and the plurality of first front surface connection pads 242, and may electrically connect the memory semiconductor structure 200 to the wiring interposer 400. The plurality of second interposer connection terminals 150 may be disposed between the plurality of interposer upper surface pads 432 and the plurality of third front surface connection pads 120, and may electrically connect the logic semiconductor chip 100 to the wiring interposer 400. The third interposer connection terminal 450 may be disposed between the plurality of interposer substrate pads 434P and the plurality of upper surface substrate pads 320P1, and may electrically connect the wiring interposer 400 to the package substrate 300.

A first under-fill layer 202 may be disposed between the wiring interposer 400 and the memory semiconductor structure 200, and a second under-fill layer 170 may be disposed between the wiring interposer 400 and the logic semiconductor chip 100. The first under-fill layer 202 may cover the plurality of first interposer connection terminals 205, and the second under-fill layer 170 may cover the plurality of second interposer connection terminals 150. Each of the first under-fill layer 202 and the second under-fill layer 170 may be made of, e.g., an epoxy resin formed by a capillary under-fill method. In some embodiments, each of the first under-fill layer 202 and the second under-fill layer 170 may be a non-conductive film (NCF).

The memory semiconductor structure 200 may be accommodated in the substrate cavity 300C. The number of substrate cavities 300C of the package substrate 300 may correspond to the number of memory semiconductor structures 200 included in the semiconductor package 1000. The at least one memory semiconductor structure 200 may be disposed in the substrate cavity 300C. In some embodiments, when one memory semiconductor structure 200 is disposed in one substrate cavity 300C, the number of substrate cavities 300C of the package substrate 300 may be the same as the number of memory semiconductor structures 200 included in the semiconductor package 1000. In some embodiments, when at least two memory semiconductor structures 200 are disposed in one substrate cavity 300C, the number of substrate cavities 300C of the package substrate 300 may be less than the number of memory semiconductor structures 200 included in the semiconductor package 1000. For example, when the semiconductor package 1000 includes eight memory semiconductor structures 200, the number of substrate cavities 300C of the package substrate 300 may be eight, four, or two.

The wiring interposer 400 may be disposed on the package substrate 300, and a part of the at least one memory semiconductor structure 200 attached to the lower surface of the wiring interposer 400 may be accommodated in the substrate cavity 300C. The plurality of third interposer connection terminals 450 may be disposed between the wiring interposer 400 and the package substrate 300. The upper end of each of the plurality of third interposer connection terminals 450 may be connected to each of the plurality of interposer substrate pads 434P of the wiring interposer 400, and the lower end of each of the plurality of third interposer connection terminals 450 may be connected to each of the plurality of upper surface substrate pads 320P1 of the package substrate 300. The wiring interposer 400 and the package substrate 300 may be spaced apart with the plurality of third interposer connection terminals 450 therebetween. That is, the wiring interposer 400 and the package substrate 300 may be spaced apart by the third height H3 in the vertical direction. The third height H3 may be a separation distance between the lower surface of the wiring interposer 400 and the upper surface of the package substrate 300.

The height of each of the plurality of first interposer connection terminals 205 may be less than the third height H3. For example, a part of the memory semiconductor structure 200 adjacent to the wiring interposer 400 may not be accommodated in the substrate cavity 300C, and the remaining part thereof may be accommodated in the substrate cavity 300C. In some embodiments, a thickness of the part of the memory semiconductor structure 200 that is not accommodated in the substrate cavity 300C may correspond to the third height H3 that is the height of the third interposer connection terminal 450. For example, the thickness of the part of the memory semiconductor structure 200 that is not accommodated in the substrate cavity 300C may have a value obtained by subtracting the height of the first interposer connection terminal 205 from the height of the third interposer connection terminal 450.

A filling under-fill layer 350 may fill the substrate cavity 300C. The memory semiconductor structure 200 may be accommodated in the substrate cavity 300C so as to be spaced apart from the inner surface and the bottom surface of the substrate cavity 300C. The filling under-fill layer 350 may fill a space between the memory semiconductor structure 200 and the inner surface of the substrate cavity 300C and a space between the memory semiconductor structure 200 and the bottom surface of the substrate cavity 300C. For example, the substrate cavity 300C may be completely filled by the memory semiconductor structure 200 and the filling under-fill layer 350. In some embodiments, the filling under-fill layer 350 may fill the substrate cavity 300C and a space between the package substrate 300 and the wiring interposer 400. For example, the filling under-fill layer 350 may fill a space between the package substrate 300 and the wiring interposer 400 while surrounding the plurality of third interposer connection terminals 450. In some embodiments, the filling under-fill layer 350 may be made of an epoxy resin formed by the capillary under-fill method.

The at least one conductive spacer 620 may be disposed on the upper surface of the wiring interposer 400. In some embodiments, the at least one conductive spacer 620 may include metal. For example, the at least one conductive spacer 620 may be aluminum (Al), copper (Cu), or tungsten (W) or an alloy thereof. For example, the thickness of the at least one conductive spacer 620 may be about 100 nm to about 300 nm.

At least a part of the at least one memory semiconductor structure 200 may overlap the at least one conductive spacer 620 in the vertical direction. In some embodiments, a horizontal area of the at least one conductive spacer 620 may be equal to or greater than a horizontal area of the at least one memory semiconductor structure 200, and the at least one memory semiconductor structure 200 may overlap the at least one conductive spacer 620 in the vertical direction, e.g., the at least one conductive spacer 620 may overlap an entire area of the upper surface of the at least one memory semiconductor structure 200.

The number of the at least one conductive spacers 620 attached to the upper surface of the wiring interposer 400 may correspond to the number of memory semiconductor structures 200 included in the semiconductor package 1000, e.g., so each conductive spacer 620 completely overlaps a corresponding memory semiconductor structure 200. The number of conductive spacers 620 included in the semiconductor package 1000 may be equal to or less than the number of memory semiconductor structures 200 included in the semiconductor package 1000. For example, when the semiconductor package 1000 includes eight memory semiconductor structures 200, the number of conductive spacers 620 may be eight, four, or two, e.g., a plurality of conductive spacer 620 may be arranged to completely overlap one memory semiconductor structure 200.

In some embodiments, a spacer adhesive layer 610 may be disposed between the upper surface of the wiring interposer 400 and the lower surface of the at least one conductive spacer 620. In some embodiments, the spacer adhesive layer 610 may be omitted.

The upper surface of the at least one logic semiconductor chip 100 and the upper surface of the at least one conductive spacer 620 may be positioned at substantially the same vertical level, e.g., the upper surfaces of the at least one logic semiconductor chip 100 and the at least one conductive spacer 620 may face a same direction and be coplanar with each other. In some embodiments, one of the upper surface of the at least one logic semiconductor chip 100 and the upper surface of the at least one conductive spacer 620 may be positioned at a relatively high vertical level, and a difference in the vertical level between the upper surface of the at least one logic semiconductor chip 100 and the upper surface of the at least one conductive spacer 620 may be less than the thickness of a thermal conductive material layer 710.

A heat dissipation member 720 may be disposed on the at least one logic semiconductor chip 100 and the at least one conductive spacer 620, e.g., the at least one logic semiconductor chip 100 and the at least one conductive spacer 620 may be between the heat dissipation member 720 and the wiring interposer 400. The heat dissipation member 720 may be disposed over the at least one logic semiconductor chip 100 and the at least one conductive spacer 620, e.g., the heat dissipation member 720 may be disposed to completely cover and overlap the upper surfaces of the at least one logic semiconductor chip 100 and the at least one conductive spacer 620. For example, a horizontal area of the heat dissipation member 720 may be larger than a footprint occupied by the at least one logic semiconductor chip 100 and the at least one conductive spacer 620. The footprint occupied by the at least one logic semiconductor chip 100 and the at least one conductive spacer 620 means a total area occupied by the at least one logic semiconductor chip 100 and the at least one conductive spacer 620, e.g., including an area occupied by a space between the at least one logic semiconductor chip 100 and the at least one conductive spacer 620. For example, the footprint occupied by the at least one logic semiconductor chip 100 and the at least one conductive spacer 620 may include a part between the at least one logic semiconductor chip 100 and the at least one conductive spacer 620, and may be one area in the upper surface of the wiring interposer 400 on which the at least one logic semiconductor chip 100 and the at least one conductive spacer 620 are disposed.

The thermal conductive material layer 710 may be disposed between the at least one logic semiconductor chip 100 and the heat dissipation member 720, and between the at least one conductive spacer 620 and the heat dissipation member 720. In some embodiments, the thermal conductive material layer 710 may completely cover, e.g., an entirety of, the lower surface of the heat dissipation member 720.

The thermal conductive material layer 710 may be made of a thermal interface material (TIM). For example, the thermal conductive material layer 710 may be made of an insulating material or a material capable of maintaining electrical insulation including an insulating material. The thermal conductive material layer 710 may include, e.g., epoxy resin. The thermal conductive material layer 710 may include, e.g., mineral oil, grease, gap filler putty, phase change gel, phase change material pads, or a particle filled epoxy.

The heat dissipation member 720 may be disposed on the thermal conductive material layer 710. The heat dissipation member 720 may be, e.g., a heat sink, a heat spreader, a heat pipe, or a liquid cooled cold plate.

Inside the memory semiconductor structure 200, a heating value of the first semiconductor chip 210 may be greater than heating values of the plurality of second semiconductor chips 260. That is, inside the memory semiconductor structure 200, the first semiconductor chip 210 may be a hot spot with a relatively high heating value.

The memory semiconductor structure 200 may be attached to the lower surface of the wiring interposer 400, and the conductive spacer 620 may be attached to the upper surface of the wiring interposer 400 so as to overlap the memory semiconductor structure 200 in the vertical direction. The memory semiconductor structure 200 may be attached to the lower surface of the wiring interposer 400 so that the first semiconductor chip 210 is more adjacent to the wiring interposer 400 than the plurality of second semiconductor chips 260. For example, as illustrated in FIG. 1, a vertical distance between an upper surface of the first semiconductor chip 210 and a lower surface of the wiring interposer 400 may be smaller than the vertical distance between an upper surface of an uppermost of the second semiconductor chips 260 and the lower surface of the wiring interposer 400. Accordingly, the first semiconductor chip 210, which is the hot spot, may be disposed to be more adjacent, e.g., closer, to the conductive spacer 620 than the plurality of second semiconductor chips 260 are to the conductive spacer 620.

The semiconductor package 1000 may transfer heat generated in the first semiconductor chip 210, which is the hot spot inside the memory semiconductor structure 200, to the heat dissipation member 720 through the wiring interposer 400 and the conductive spacer 620, and also transfer heat generated in the logic semiconductor chip 100 to the heat dissipation member 720, thereby improving heat dissipation characteristics. Also, a part of the at least one memory semiconductor structure 200 is accommodated in the substrate cavity 300C of the package substrate 300, and thus, the volume of the semiconductor package 1000 may be reduced.

FIGS. 2A to 2J are cross-sectional views illustrating stages in a manufacturing method of a semiconductor package according to some embodiments. In detail, FIGS. 2A to 2J are cross-sectional views illustrating stages in the manufacturing method of the semiconductor package 1000 shown in FIG. 1, and descriptions of FIGS. 2A to 2J redundant with respect to those of FIG. 1 may be omitted.

Figure 2A:
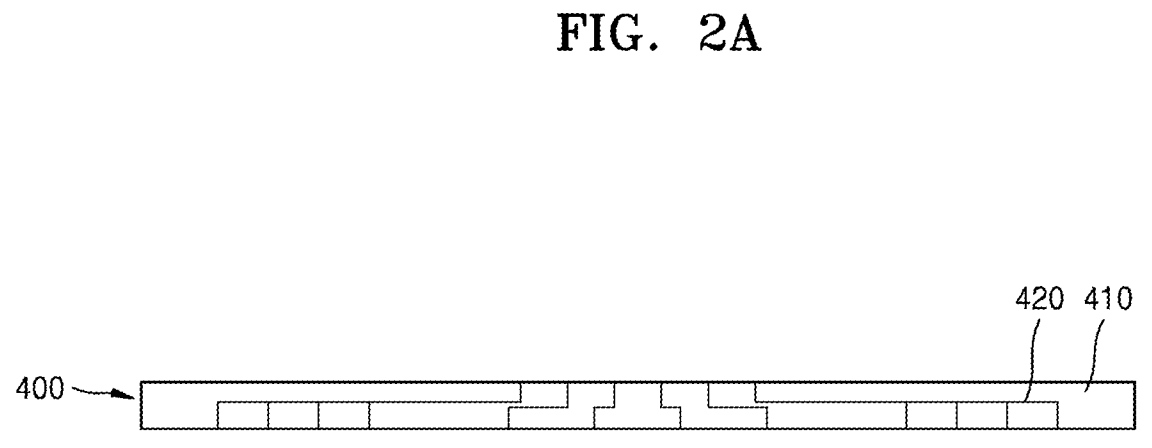

Referring to FIG. 2A, the wiring interposer 400 including the interposer base layer 410 and the interposer wiring layer 420 is prepared. At least a part of the interposer wiring layer 420 may be penetration electrodes penetrating at least a part of the interposer base layer 410.

Figure 2B:
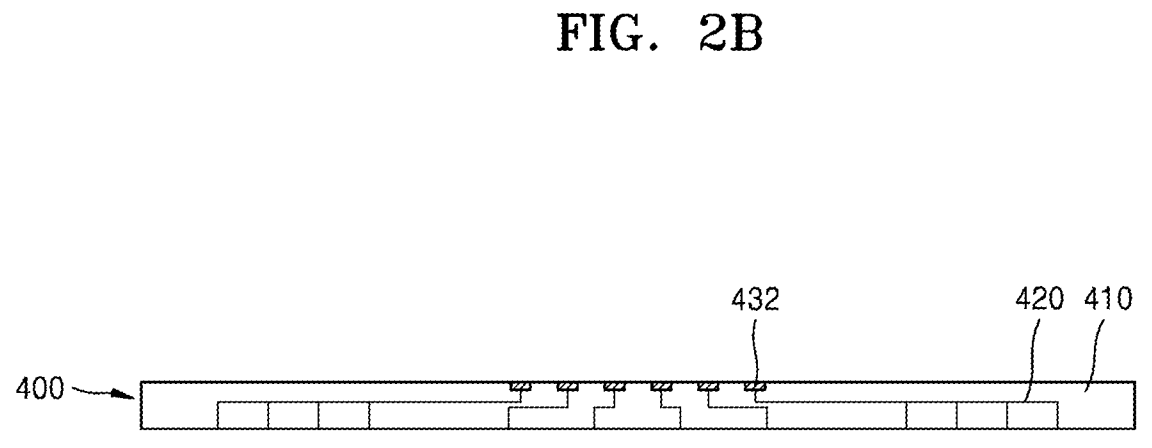

Referring to FIG. 2B, the plurality of interposer upper surface pads 432 are formed on the upper surface of the interposer base layer 410. The plurality of interposer upper surface pads 432 may be formed to be electrically connected to the interposer wiring layer 420.

Figure 2C:
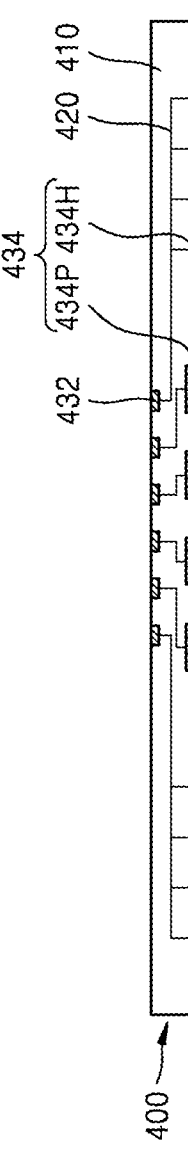

Referring to FIG. 2C, the plurality of interposer lower surface pads 434 are formed on the lower surface of the interposer base layer 410. The plurality of interposer lower surface pads 434 may be formed to be electrically connected to the interposer wiring layer 420. The plurality of interposer lower surface pads 434 434 may be formed to include the plurality of interposer chip pads 434H and the plurality of interposer substrate pads 434P. Each of the plurality of interposer substrate pads 434P may be formed to have a larger horizontal width than that of each of the plurality of interposer chip pads 434H. In some embodiments, the plurality of interposer chip pads 434H may be respectively formed to be disposed on the periphery of the plurality of interposer substrate pads 434P.

Figure 2D:
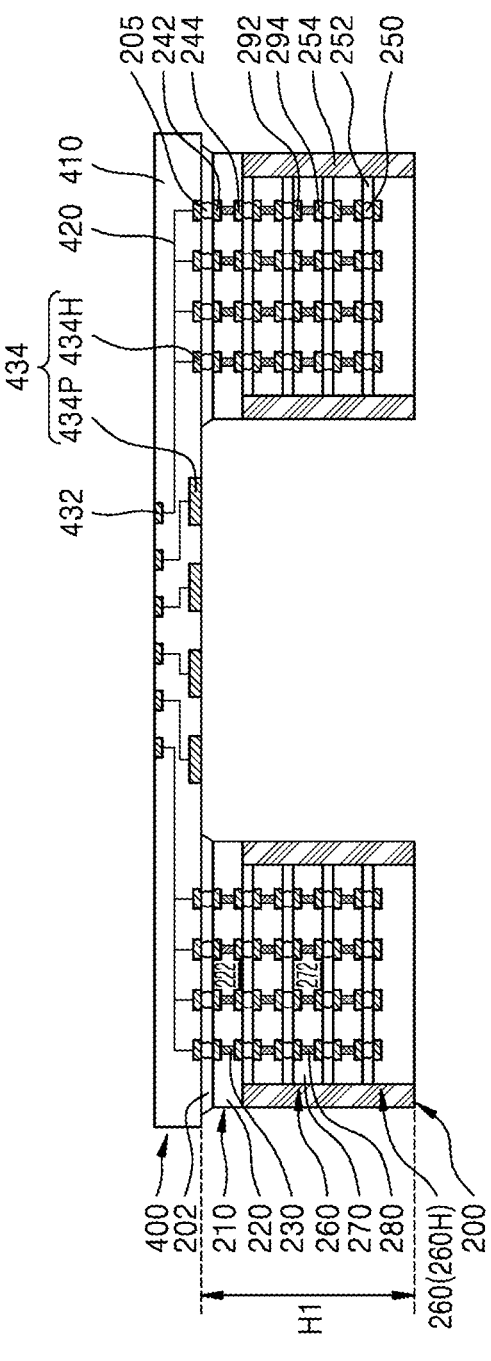

Referring to FIG. 2D, the at least one memory semiconductor structure 200 is attached to the lower surface of the wiring interposer 400, e.g., to a surface of the wiring interposer 400 including the interposer lower surface pads 434. In some embodiments, a plurality of memory semiconductor structures 200 spaced apart from each other in a horizontal direction may be attached to the lower surface of the wiring interposer 400.

For example, after respectively attaching the plurality of first interposer connection terminals 205 to the plurality of interposer chip pads 434H, the at least one memory semiconductor structure 200 may be attached to the lower surface of the wiring interposer 400 so that the plurality of first interposer connection terminals 205 and the plurality of first front surface connection pads 242 are connected to each other. Alternatively, e.g., after respectively attaching the plurality of first interposer connection terminals 205 to the plurality of first front surface connection pads 242, the at least one memory semiconductor structure 200 may be attached to the lower surface of the wiring interposer 400 so that the plurality of first interposer connection terminals 205 and the plurality of interposer chip pads 434H are connected to each other.

The first under-fill layer 202 may be formed between the wiring interposer 400 and the memory semiconductor structure 200. The first under-fill layer 202 may be formed to surround the plurality of first interposer connection terminals 205 and fill a space between the wiring interposer 400 and the memory semiconductor structure 200.

Figure 2E:
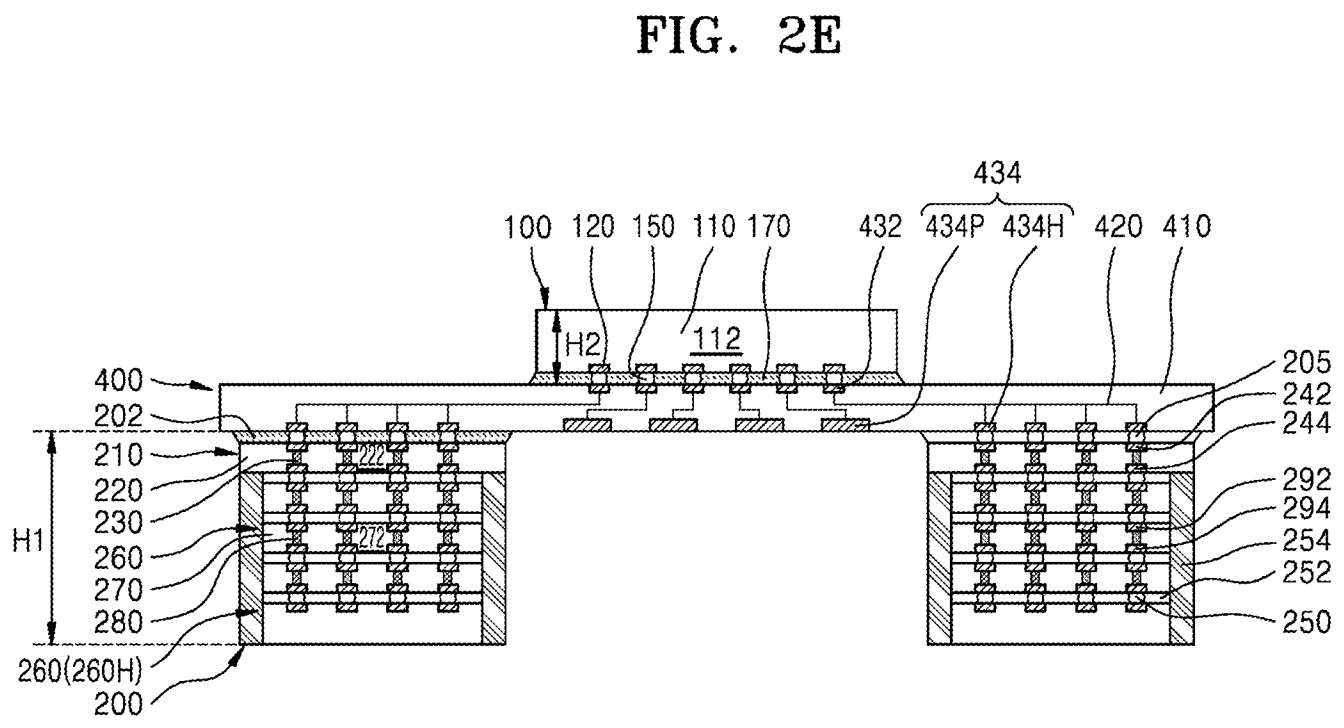

Referring to FIG. 2E, the at least one logic semiconductor chip 100 is attached to the upper surface of the wiring interposer 400, e.g., a surface of the wiring interposer 400 opposite to the surface of the wiring interposer 400 including the interposer lower surface pads 434. For example, after respectively attaching the plurality of second interposer connection terminals 150 to the plurality of third front surface connection pads 120, the at least one logic semiconductor chip 100 may be attached to the upper surface of the wiring interposer 400 so that the plurality of second interposer connection terminals 150 and the plurality of interposer upper surface pads 432 are connected to each other. Alternatively, e.g., after respectively attaching the plurality of second interposer connection terminals 150 to the plurality of interposer upper surface pads 432, the at least one logic semiconductor chip 100 may be attached to the upper surface of the wiring interposer 400 so that the plurality of second interposer connection terminals 150 and the plurality of third front surface connection pads 120 are connected to each other.

The second under-fill layer 170 may be formed between the wiring interposer 400 and the logic semiconductor chip 100. The second under-fill layer 170 may be formed to surround the plurality of second interposer connection terminals 150 and fill a space between the wiring interposer 400 and the logic semiconductor chip 100.

Figure 2F:
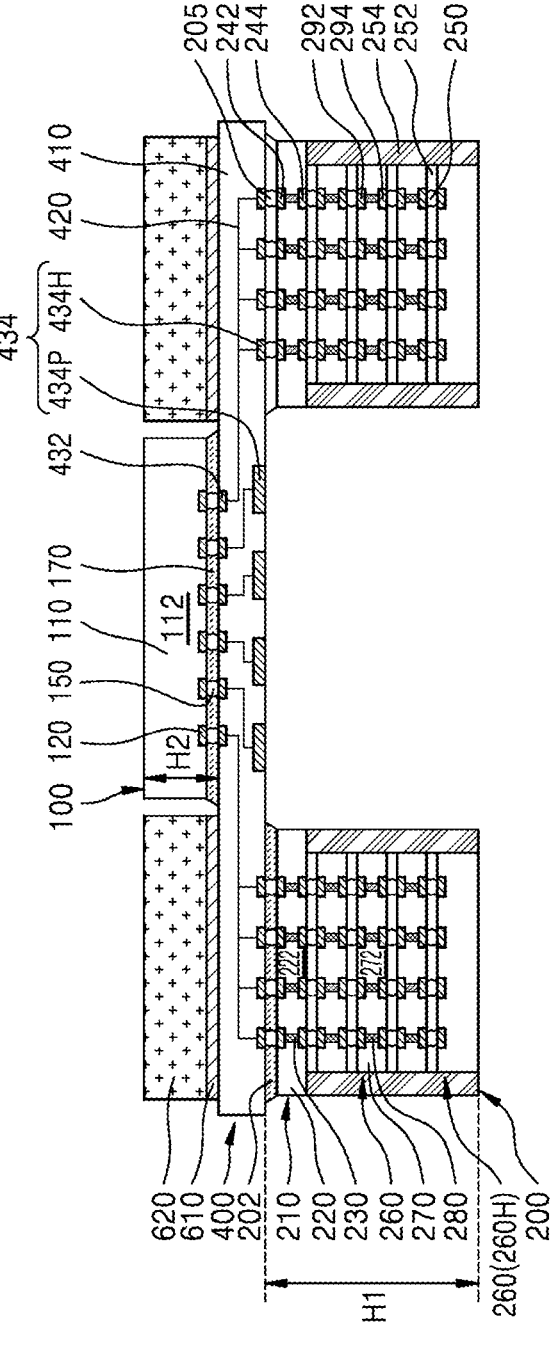

Referring to FIG. 2F, the at least one conductive spacer 620 is attached to the upper surface of the wiring interposer 400. The at least one conductive spacer 620 may be attached to the upper surface of the wiring interposer 400 so as to overlap the at least one memory semiconductor structure 200 in a vertical direction.

In some embodiments, after attaching the spacer adhesive layer 610 to the lower surface of the conductive spacer 620, the conductive spacer 620 may be attached to the upper surface of the wiring interposer 400 so that the spacer adhesive layer 610 comes into, e.g., direct, contact with the upper surface of the wiring interposer 400.

In some embodiments, the at least one conductive spacer 620 may be attached on the upper surface of the wiring interposer 400 so that the upper surface of the at least one conductive spacer 620 is positioned at substantially the same vertical level as the upper surface of the at least one logic semiconductor chip 100.

Figure 2G:
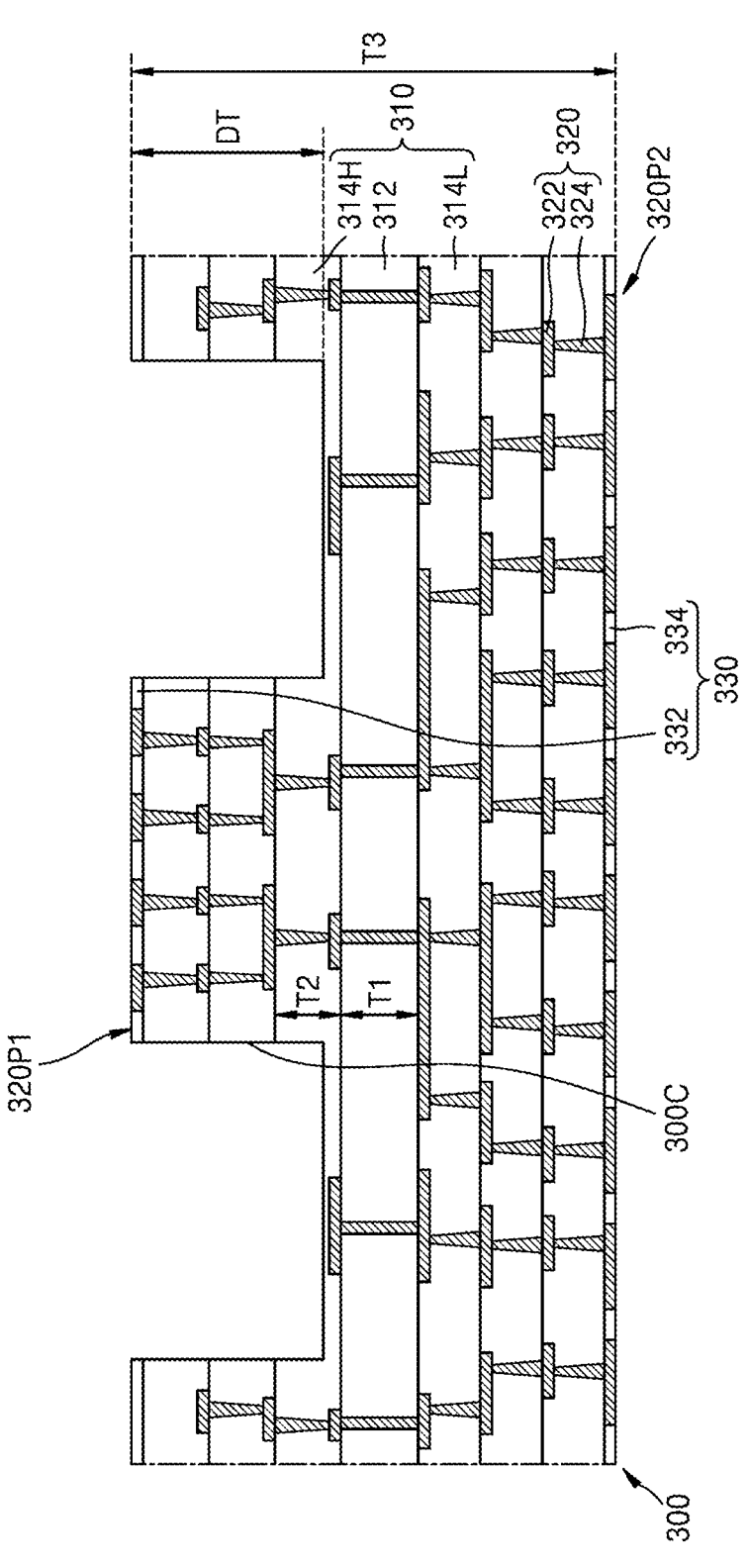

Referring to FIG. 2G, the package substrate 300 is prepared. The package substrate 300 may be formed to include the plurality of stacked base layers 310 and the substrate wiring layer 320. The package substrate 300 may include the at least one substrate cavity 300C. The at least one substrate cavity 300C may be formed to extend from the upper surface of the package substrate 300 to the inside, e.g., so portions of the upper prepreg layers 314H (e.g., portions of at least two topmost ones of the stacked upper prepreg layers 314H) may be removed to form the substrate cavity 300C.

Figure 2H:
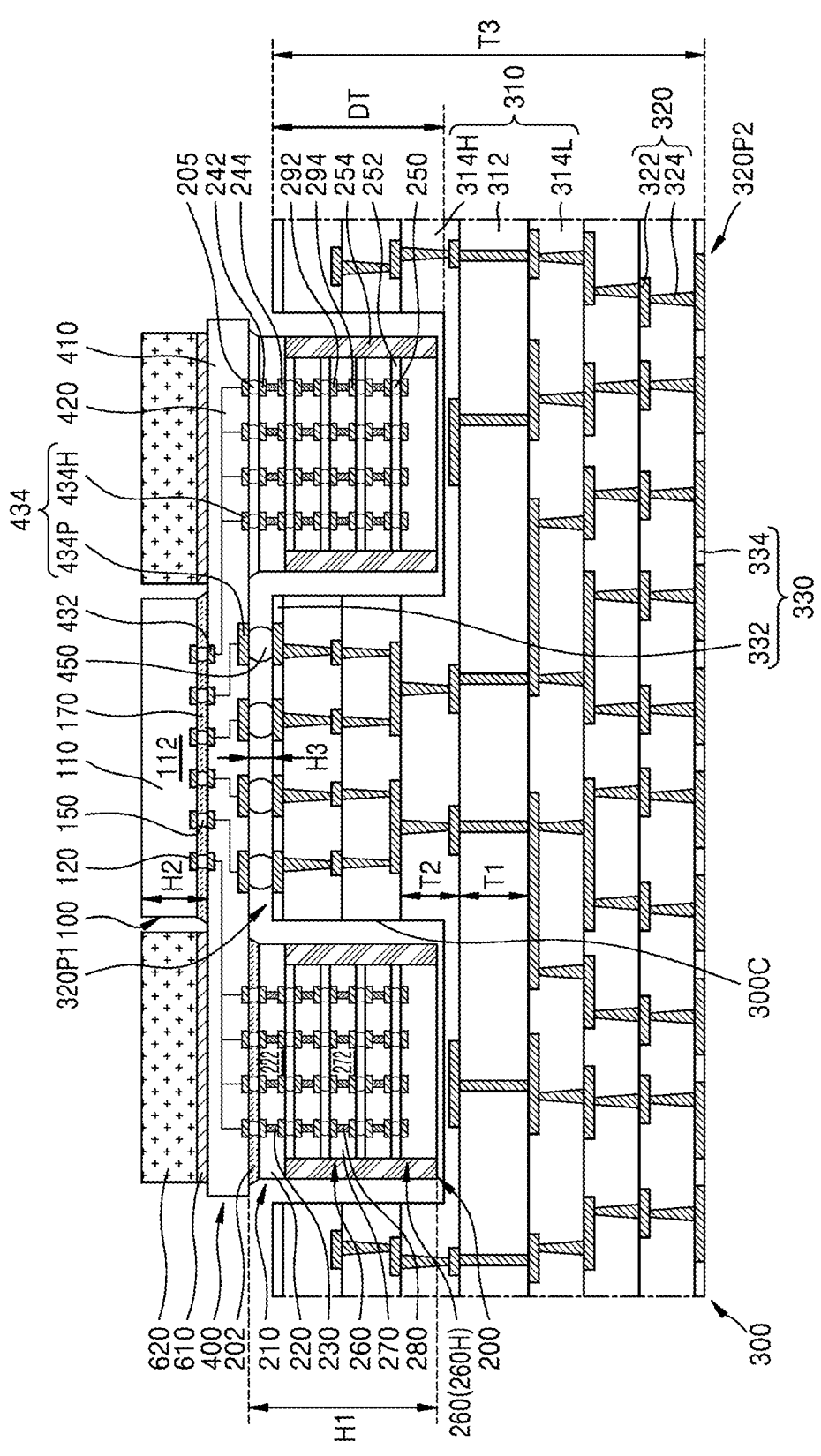

Referring to FIG. 2H, the product of FIG. 2F, i.e., the wiring interposer 400 having the upper surface and the lower surface to which the at least one logic semiconductor chip 100 and the at least one memory semiconductor structure 200 are respectively attached, may be attached onto the package substrate 300.

The wiring interposer 400 may be attached on the package substrate 300 so that a part of the at least one memory semiconductor structure 200 attached to the lower surface of the wiring interposer 400 is accommodated in the substrate cavity 300C. The wiring interposer 400 may be attached on the package substrate 300 so that upper and lower ends of the plurality of third interposer connection terminals 450 are respectively connected to the plurality of interposer substrate pads 434P and the plurality of upper surface substrate pads 320P1. The wiring interposer 400 and the package substrate 300 may be spaced apart with the plurality of third interposer connection terminals 450 therebetween.

Figure 2I:
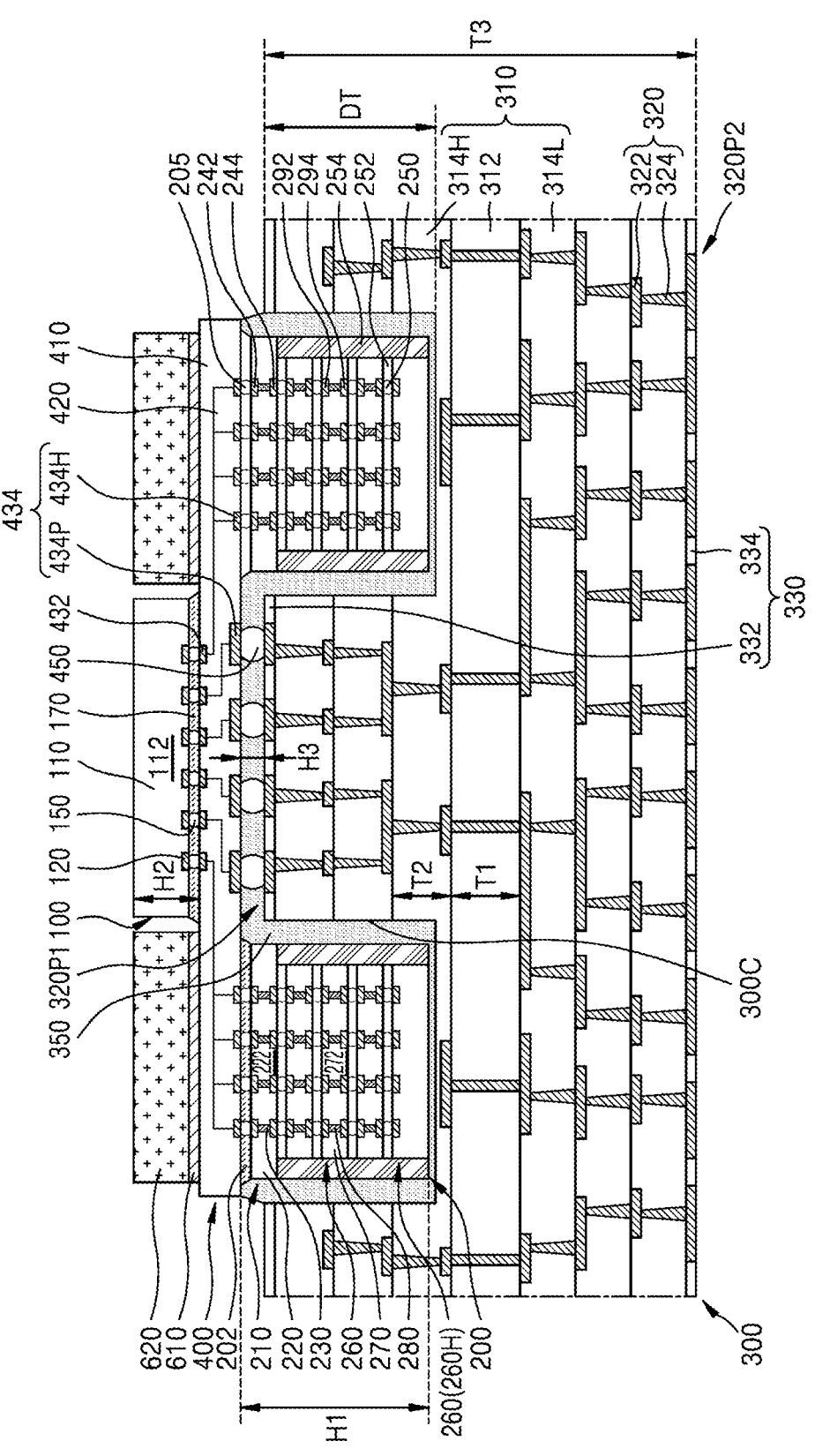

Referring to FIG. 2I, after attaching the wiring interposer 400 on the package substrate 300, the filling under-fill layer 350 filling the substrate cavity 300C may be formed. The filling under-fill layer 350 may be formed to fill the substrate cavity 300C, surround the plurality of third interposer connection terminals 450, and fill a space between the package substrate 300 and the wiring interposer 400.

Figure 2J:
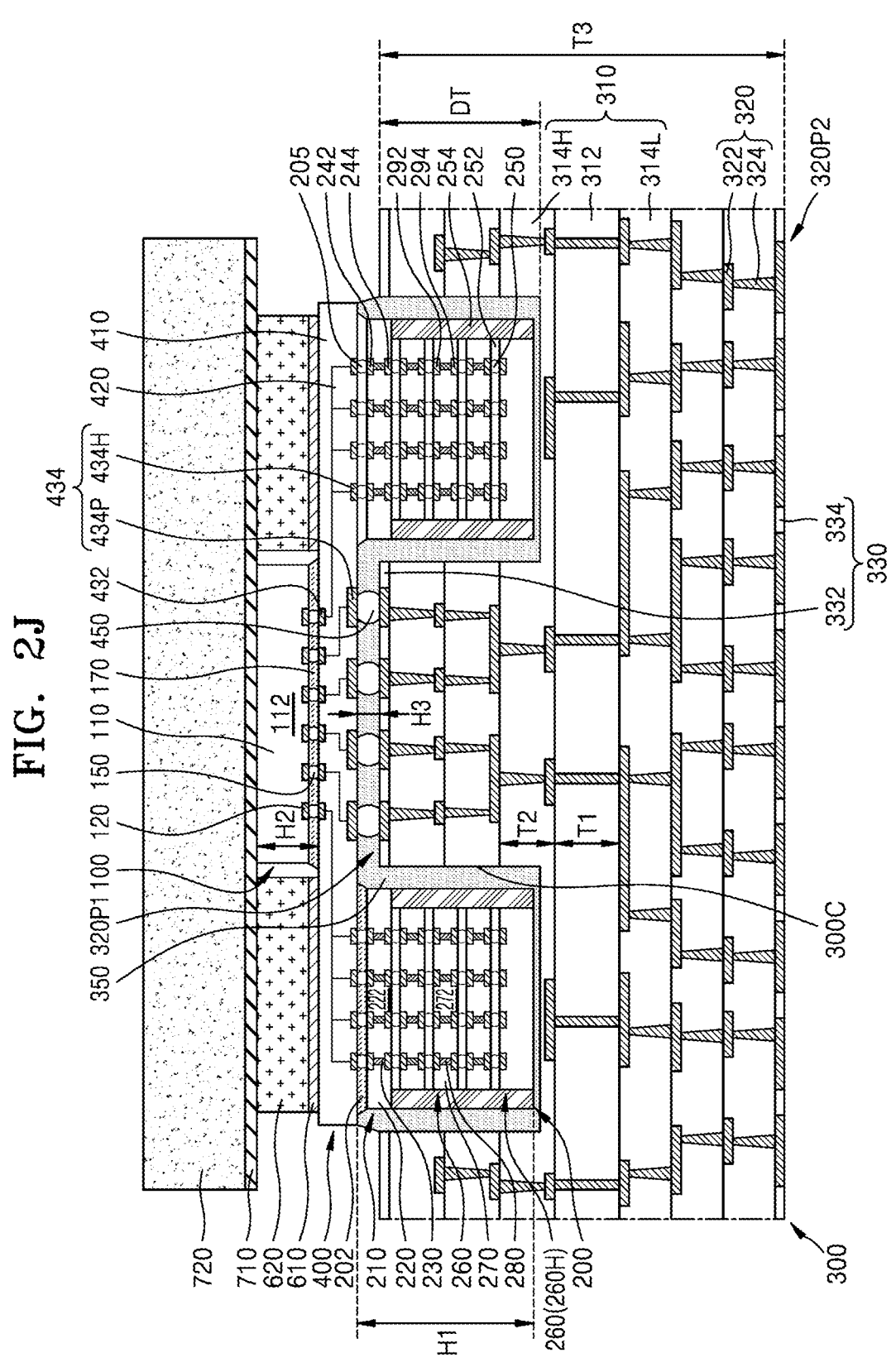

Referring to FIG. 2J, the heat dissipation member 720 is attached on the at least one logic semiconductor chip 100 and the at least one conductive spacer 620. The heat dissipation member 720 may be attached to be disposed over the at least one logic semiconductor chip 100 and the at least one conductive spacer 620. In some embodiments, after forming the thermal conductive material layer 710 covering the, e.g., entire, lower surface of the heat dissipation member 720, the heat dissipation member 720 may be attached onto the at least one logic semiconductor chip 100 and the at least one conductive spacer 620 so that the thermal conductive material layer 710 is disposed between the at least one logic semiconductor chip 100 and the heat dissipation member 720 and between the at least one conductive spacer 620 and the heat dissipation member 720.

Then, as shown in FIG. 1, the plurality of external connection terminals 500 may be attached to the plurality of lower surface substrate pads 320P2. Thus, the semiconductor package 1000 may be formed.

Figure 3:
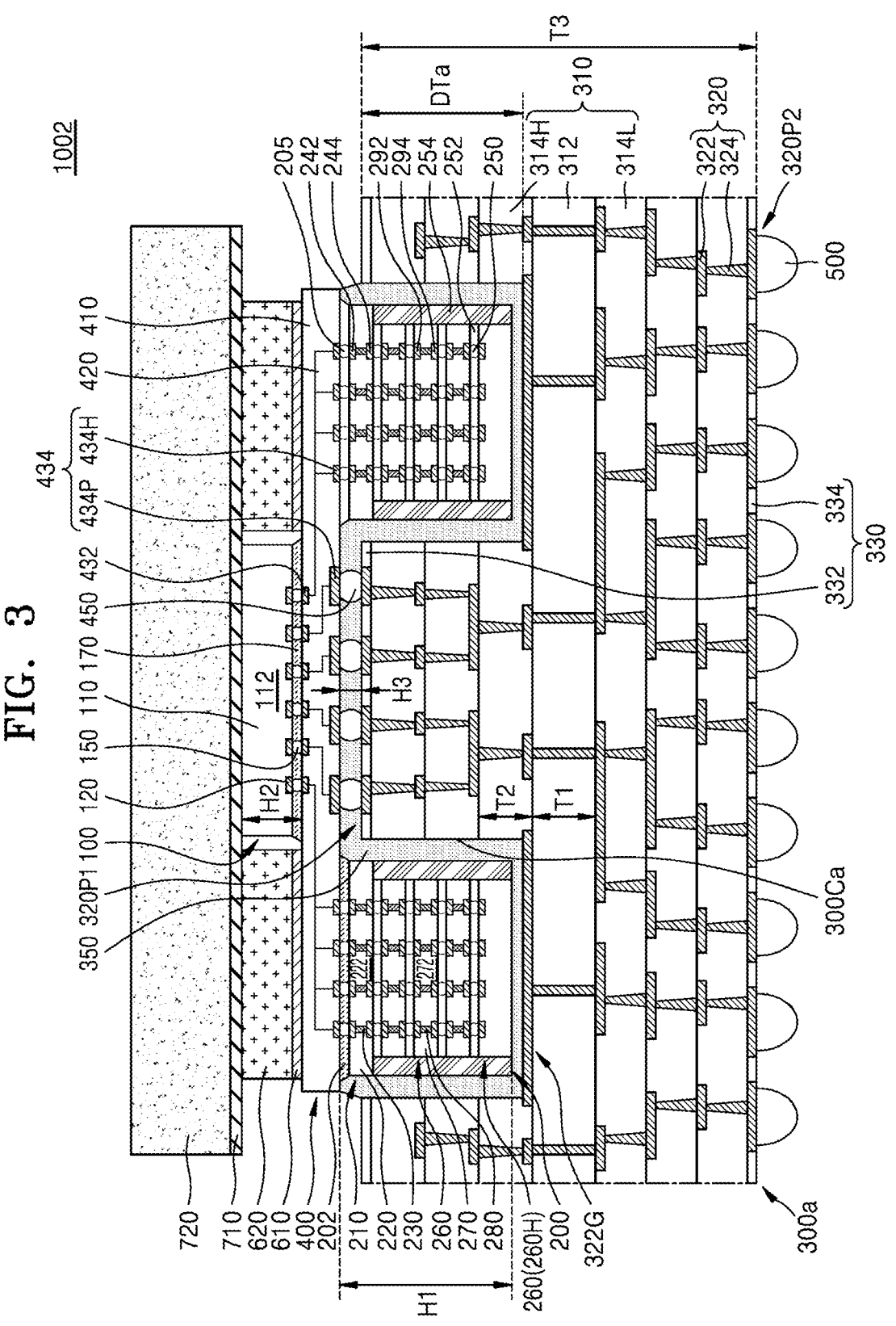
FIG. 3 is a cross-sectional view of a semiconductor package according to some embodiments.

FIG. 3 is a cross-sectional view of a semiconductor package according to some embodiments. In FIG. 3, the same reference numerals as those in FIG. 1 denote the same elements, and descriptions redundant with those of FIG. 1 may be omitted.

Referring to FIG. 3, a semiconductor package 1002 includes a package substrate 300a, the wiring interposer 400 disposed on the package substrate 300a, the at least one logic semiconductor chip 100 attached to the upper surface of the wiring interposer 400, and the at least one memory semiconductor structure 200 attached to the lower surface of the wiring interposer 400.

The package substrate 300a may include at least one substrate cavity 300Ca extending from the upper surface to the inside. The at least one substrate cavity 300Ca may extend from the upper surface of the package substrate 300a toward the lower surface of the package substrate 300a. The substrate cavity 300Ca may penetrate the upper prepreg layer 314H. For example, a part of the upper prepreg layer 314H may not be exposed to the bottom surface of the substrate cavity 300Ca. In some embodiments, when the package substrate 300a includes the plurality of upper prepreg layers 314H stacked on the upper surface of the core layer 312, the substrate cavity 300Ca may penetrate all of the plurality of upper prepreg layers 314H but may not penetrate the core layer 312.

A ground wiring pattern 322G, which is a part of the plurality of wiring patterns 322, may be exposed to the bottom surface of the substrate cavity 300Ca. In some embodiments, the ground wiring pattern 322G may completely cover the upper surface of the core layer 312 from the bottom surface of the substrate cavity 300Ca, so that only the ground wiring pattern 322G may be exposed to the bottom surface of the substrate cavity 300Ca. For example, ground may be provided to the ground wiring pattern 322G. In some embodiments, the ground wiring pattern 322G may function as an etch stop layer when forming the substrate cavity 300Ca in the package substrate 300a. In some embodiments, the ground wiring pattern 322G and a part of the core layer 312 may be exposed together to the bottom surface of the substrate cavity 300Ca as shown in FIG. 4.

The substrate cavity 300Ca may have a cavity depth DTa between the upper surface of the package substrate 300a and the lower surface of the substrate cavity 300Ca. The cavity depth DTa may have a value less than that of ½ of the third thickness T3.

The memory semiconductor structure 200 may be accommodated in the substrate cavity 300Ca. For example, a part of the memory semiconductor structure 200 adjacent to the wiring interposer 400 may not be accommodated in the substrate cavity 300Ca, and the remaining part may be accommodated in the substrate cavity 300Ca. The filling under-fill layer 350 may fill the substrate cavity 300Ca. The memory semiconductor structure 200 may be accommodated in the substrate cavity 300Ca so as to be spaced apart from the inner surface and the lower surface of the substrate cavity 300Ca. The filling under-fill layer 350 may fill a space between the memory semiconductor structure 200 and the inner surface of the substrate cavity 300Ca and between the memory semiconductor structure 200 and the bottom surface of the substrate cavity 300Ca. The filling under-fill layer 350 may cover the plurality of third interposer connection terminals 450 and fill a space between the package substrate 300a and the wiring interposer 400.

Figure 4:
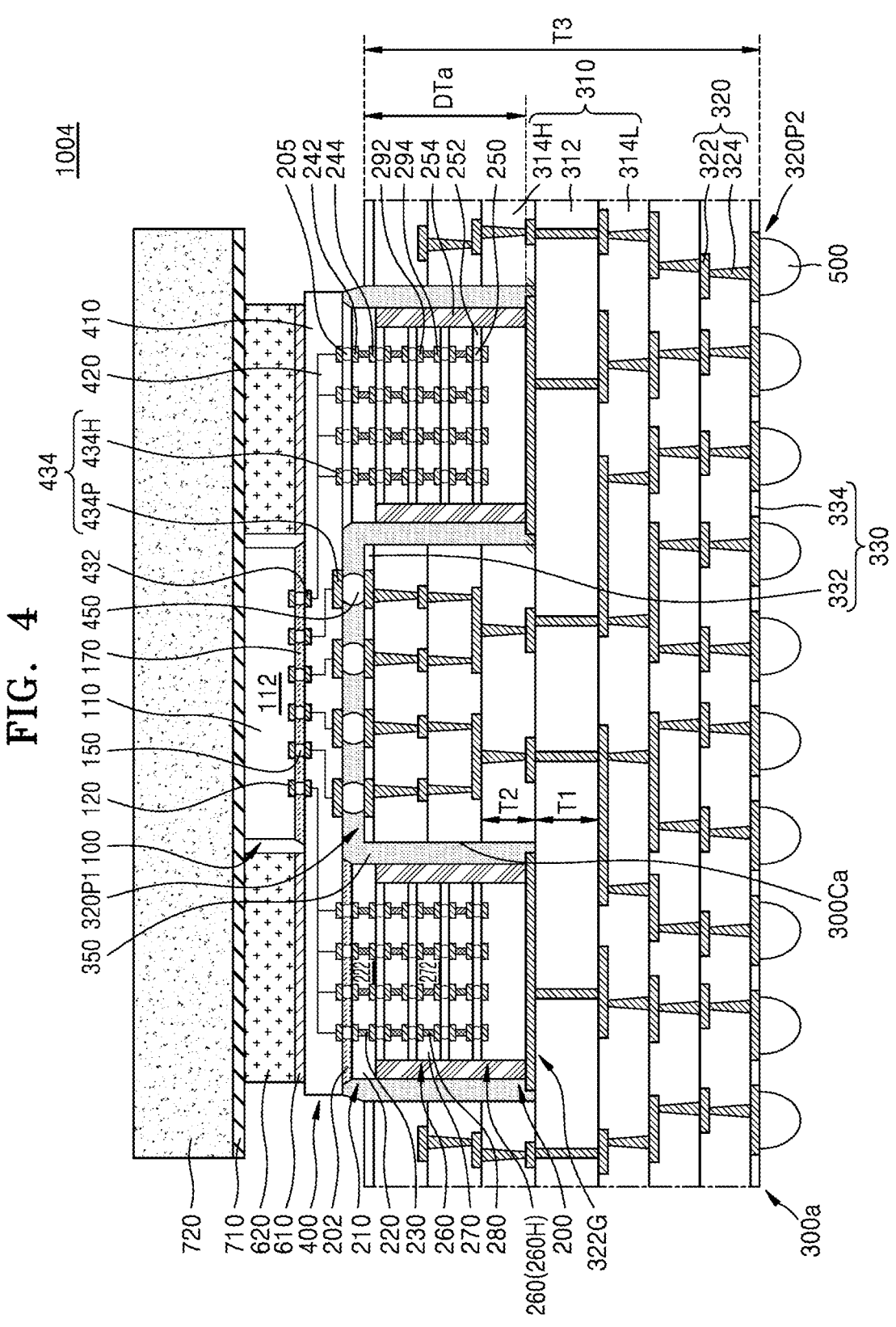
FIG. 4 is a cross-sectional view of a semiconductor package according to some embodiments.

FIG. 4 is a cross-sectional view of a semiconductor package according to some embodiments. In FIG. 4, the same reference numerals as those in FIGS. 1 and 3 denote the same elements, and descriptions redundant with those of FIGS. 1 and 3 may be omitted.

Referring to FIG. 4, a semiconductor package 1004 includes the package substrate 300a, the wiring interposer 400 disposed on the package substrate 300a, the at least one logic semiconductor chip 100 attached to the upper surface of the wiring interposer 400, and the at least one memory semiconductor structure 200 attached to the lower surface of the wiring interposer 400.

The package substrate 300a may include the at least one substrate cavity 300Ca extending from the upper surface to the inside. In some embodiments, the ground wiring pattern 322G and a part of the core layer 312 may be exposed together to the bottom surface of the substrate cavity 300Ca. For example, the bottom surface of the substrate cavity 300C may be positioned at the same vertical level as the upper surface of the core layer 312. In some embodiments, only the ground wiring pattern 322G may be exposed to the bottom surface of the substrate cavity 300Ca as shown in FIG. 3.

The memory semiconductor structure 200 may be accommodated in the substrate cavity 300Ca. For example, a part of the memory semiconductor structure 200 adjacent to the wiring interposer 400 may not be accommodated in the substrate cavity 300Ca, and the remaining part may be accommodated in the substrate cavity 300Ca. The memory semiconductor structure 200 may contact the lower surface of the substrate cavity 300Ca. For example, the lower surface of the memory semiconductor structure 200, i.e., an inactive surface of the lowermost second semiconductor chip 260H positioned farthest from the first semiconductor chip 210 among the plurality of second semiconductor chips 260, may come into, e.g., direct, contact with the ground wiring pattern 322G positioned on the bottom surface of the substrate cavity 300Ca, e.g., without the filling under-fill layer 350 therebetween. The filling under-fill layer 350 may fill the substrate cavity 300Ca, e.g., along sidewalls of the substrate cavity 300Ca but not under the memory semiconductor structure 200. The memory semiconductor structure 200 may be accommodated in the substrate cavity 300Ca so as to be spaced apart from the inner surface of the substrate cavity 300Ca. The filling under-fill layer 350 may fill a space between the memory semiconductor structure 200 and the inner surface of the substrate cavity 300Ca. The filling under-fill layer 350 may cover the plurality of third interposer connection terminals 450 and fill a space between the package substrate 300a and the wiring interposer 400.

Figure 5:
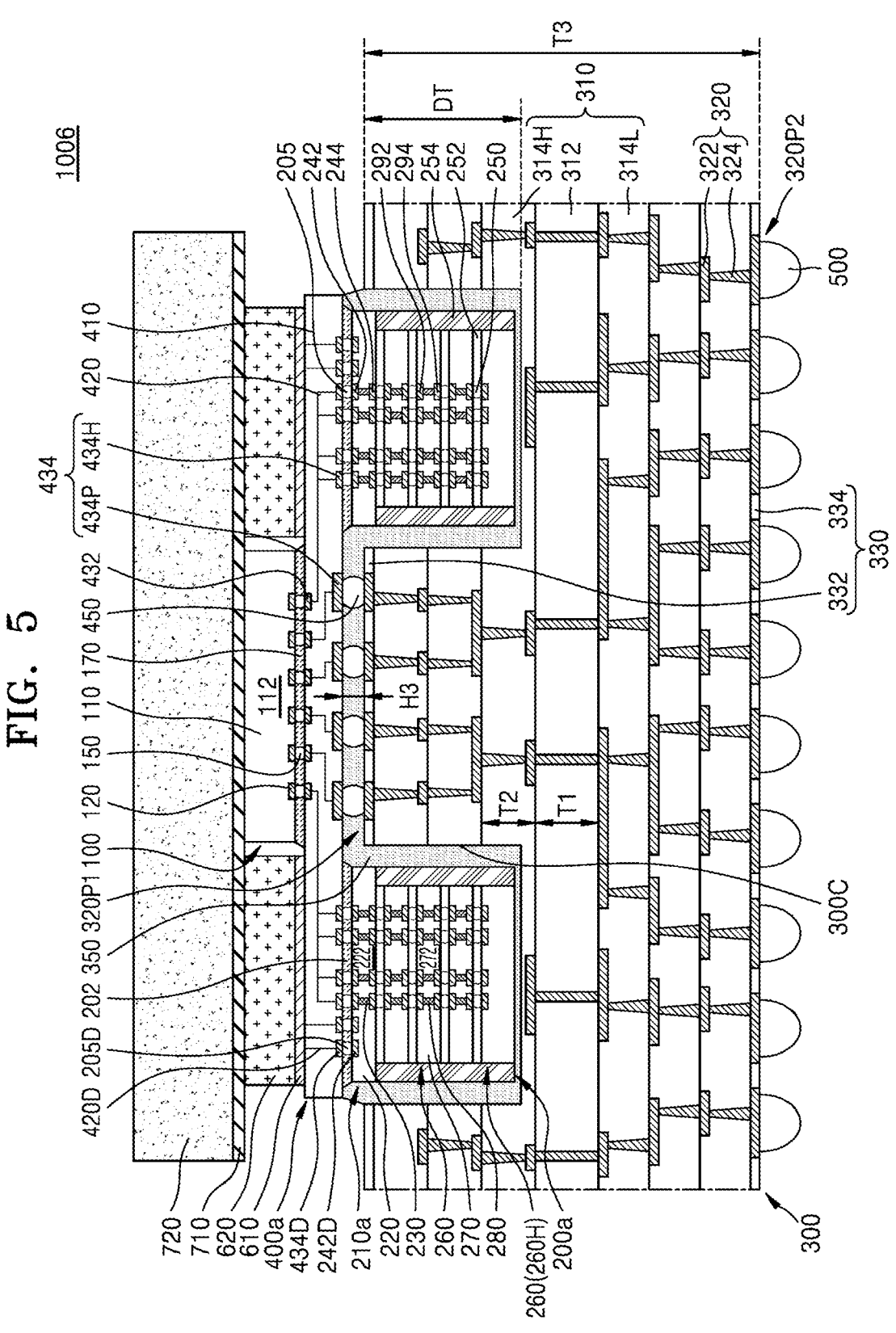
FIG. 5 is a cross-sectional view of a semiconductor package according to some embodiments.

FIG. 5 is a cross-sectional view of a semiconductor package according to some embodiments. In FIG. 5, the same reference numerals as those in FIG. 1 denote the same elements, and descriptions redundant with those of FIG. 1 may be omitted.

Referring to FIG. 5, a semiconductor package 1006 includes the package substrate 300, a wiring interposer 400a disposed on the package substrate 300, the at least one logic semiconductor chip 100 attached to the upper surface of the wiring interposer 400a, and at least one memory semiconductor structure 200a attached to the lower surface of the wiring interposer 400a. The at least one memory semiconductor structure 200a may be a stacked structure including a first semiconductor chip 210a and a plurality of second semiconductor chips 260.

Unlike the first semiconductor chip 210 shown in FIG. 1, the first semiconductor chip 210a may further include a plurality of front surface dummy pads 242D. Each of the plurality of front surface dummy pads 242D may be disposed on a first active surface of the first substrate 220 so as to be spaced apart from the plurality of first front surface connection pads 242 in a horizontal direction. In some embodiments, the plurality of front surface dummy pads 242D may not be connected to the plurality of first through electrodes 230.

Unlike the wiring interposer 400 shown in FIG. 1, the wiring interposer 400a may further include a plurality of interposer dummy lower surface pads 434D and an interposer dummy wiring layer 420D connected to the plurality of interposer dummy lower surface pads 434D. The plurality of interposer dummy lower surface pads 434D may be disposed on the lower surface of the interposer base layer 410 so as to be respectively spaced apart from the plurality of interposer lower surface pads 434 in the horizontal direction.

A plurality of dummy interposer connection terminals 205D may be disposed between the plurality of interposer dummy lower surface pads 434D and the plurality of front surface dummy pads 242D, and may thermally connect the memory semiconductor structure 200a and the wiring interposer 400a. In some embodiments, the wiring interposer 400a may further include a plurality of interposer dummy upper surface pads disposed on the upper surface of the interposer base layer 410 so as to be spaced apart from the plurality of interposer upper surface pads 432 in the horizontal direction, and connected to the interposer dummy wiring layer 420D.

The semiconductor package 1006 may transfer heat generated in the first semiconductor chip 210a to the conductive spacer 620 through the plurality of front surface dummy pads 242D, the plurality of dummy interposer connection terminals 205D, the plurality of interposer dummy lower surface pads 434D, and the interposer dummy wiring layer 420D, thereby improving heat dissipation characteristics.

Figure 6:
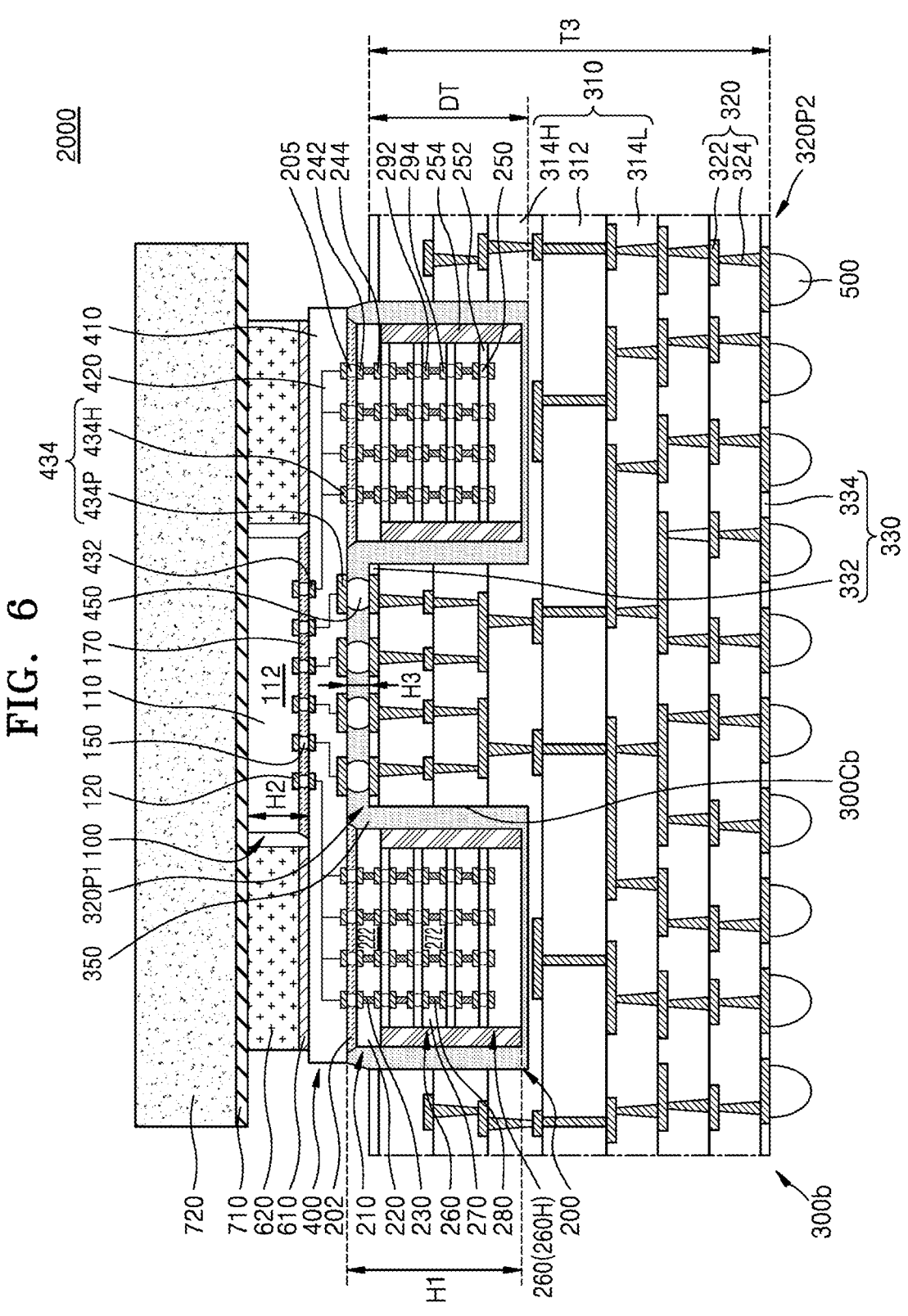
FIG. 6 is a cross-sectional view of a semiconductor package according to some embodiments.

FIG. 6 is a cross-sectional view of a semiconductor package according to some embodiments. In FIG. 6, the same reference numerals as those in FIG. 1 denote the same elements, and descriptions redundant with those of FIG. 1 may be omitted.

Referring to FIG. 6, a semiconductor package 2000 includes a package substrate 300b, the wiring interposer 400 disposed on the package substrate 300b, the at least one logic semiconductor chip 100 attached to the upper surface of the wiring interposer 400, and the at least one memory semiconductor structure 200 attached to the lower surface of the wiring interposer 400.

The package substrate 300b may include at least one substrate cavity 300Cb extending from the upper surface to the inside. In some embodiments, a part of the at least one substrate cavity 300Cb may overlap the at least one logic semiconductor chip 100 in a vertical direction.

The memory semiconductor structure 200 may be accommodated in the substrate cavity 300Cb. For example, a part of the memory semiconductor structure 200 adjacent to the wiring interposer 400 may not be accommodated in the substrate cavity 300Cb, and the remaining part may be accommodated in the substrate cavity 300Cb. The filling under-fill layer 350 may fill the substrate cavity 300Cb.

In some embodiments, a part of the at least one memory semiconductor structure 200 may overlap the at least one logic semiconductor chip 100 in the vertical direction. For example, a part of the first semiconductor chip 210 included in the memory semiconductor structure 200 may overlap the at least one logic semiconductor chip 100 in the vertical direction. Another part of the at least one memory semiconductor structure 200 may overlap the at least one conductive spacer 620 in the vertical direction.

In the semiconductor package 2000, a part of the logic semiconductor chip 100 and a part of the memory semiconductor structure 200 may overlap in the vertical direction. Thus, the horizontal area and volume of the semiconductor package 2000 may be reduced.

Figure 7:
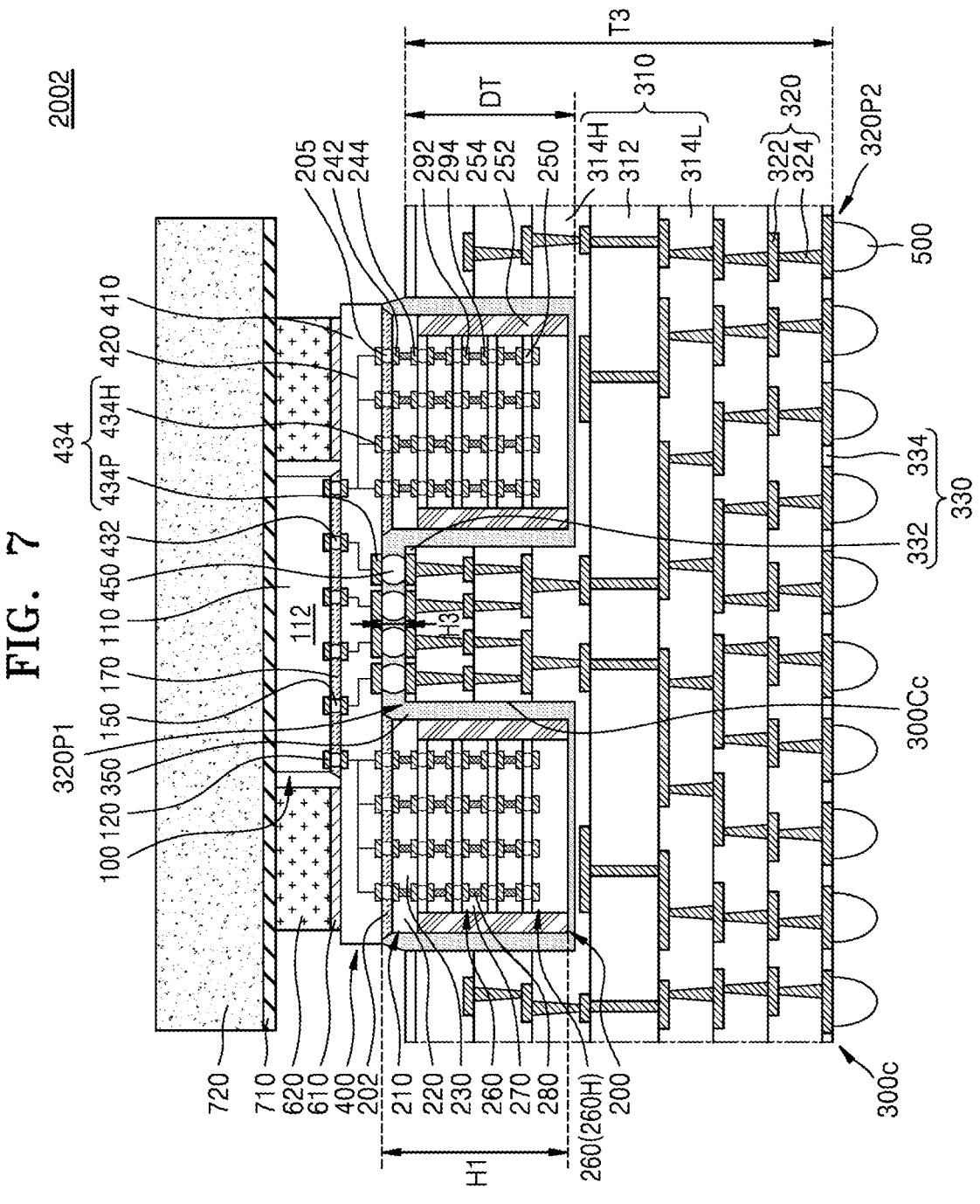
FIG. 7 is a cross-sectional view of a semiconductor package according to some embodiments.

FIG. 7 is a cross-sectional view of a semiconductor package according to some embodiments. In FIG. 7, the same reference numerals as those in FIG. 1 denote the same elements, and descriptions redundant with those of FIG. 1 may be omitted.

Referring to FIG. 7, a semiconductor package 2002 includes a package substrate 300c, the wiring interposer 400 disposed on the package substrate 300c, the at least one logic semiconductor chip 100 attached to an upper surface of the wiring interposer 400, and the at least one memory semiconductor structure 200 attached to the lower surface of the wiring interposer 400.

The package substrate 300c may include at least one substrate cavity 300Cc extending from the upper surface to the inside. In some embodiments, a part of the at least one substrate cavity 300Cc may overlap the at least one logic semiconductor chip 100 in a vertical direction.

The memory semiconductor structure 200 may be accommodated in the substrate cavity 300Cc. For example, a part of the memory semiconductor structure 200 adjacent to the wiring interposer 400 may not be accommodated in the substrate cavity 300Cc, and the remaining part may be accommodated in the substrate cavity 300Cc. The filling under-fill layer 350 may fill the substrate cavity 300Cc.

In some embodiments, a part of the at least one memory semiconductor structure 200 may overlap the at least one logic semiconductor chip 100 in the vertical direction. For example, a part of the first semiconductor chip 210 included in the memory semiconductor structure 200 and a part of each of the plurality of second semiconductor chips 260 may overlap the at least one logic semiconductor chip 100 in the vertical direction. Another part of the at least one memory semiconductor structure 200 may overlap the at least one conductive spacer 620 in the vertical direction.

In some embodiments, at least some of the plurality of first front surface connection pads 242 of the first semiconductor chip 210 may overlap the logic semiconductor chip

100 in the vertical direction. FIG. 7 shows that one of the plurality of first front surface connection pads 242 of one memory semiconductor structure 200 overlaps the logic semiconductor chip 100 in the vertical direction, but this is an example and the embodiments are not limited thereto. For example, all of the plurality of first front surface connection pads 242 of one memory semiconductor structure 200 may overlap the logic semiconductor chip 100 in the vertical direction.

In the semiconductor package 2002, a part of the logic semiconductor chip 100 and a part of the memory semiconductor structure 200 may overlap in the vertical direction, and thus, the horizontal area and volume of the semiconductor package 2002 may be reduced. In addition, in the semiconductor package 2002, at least some of the plurality of first front surface connection pads 242 of the memory semiconductor structure 200 overlap the logic semiconductor chip 100 in the vertical direction, and thus, an electrical connection path between the logic semiconductor chip 100 and the memory semiconductor structure 200 may be shortened, thereby improving operation performance of the semiconductor package 2002.

Figure 8:
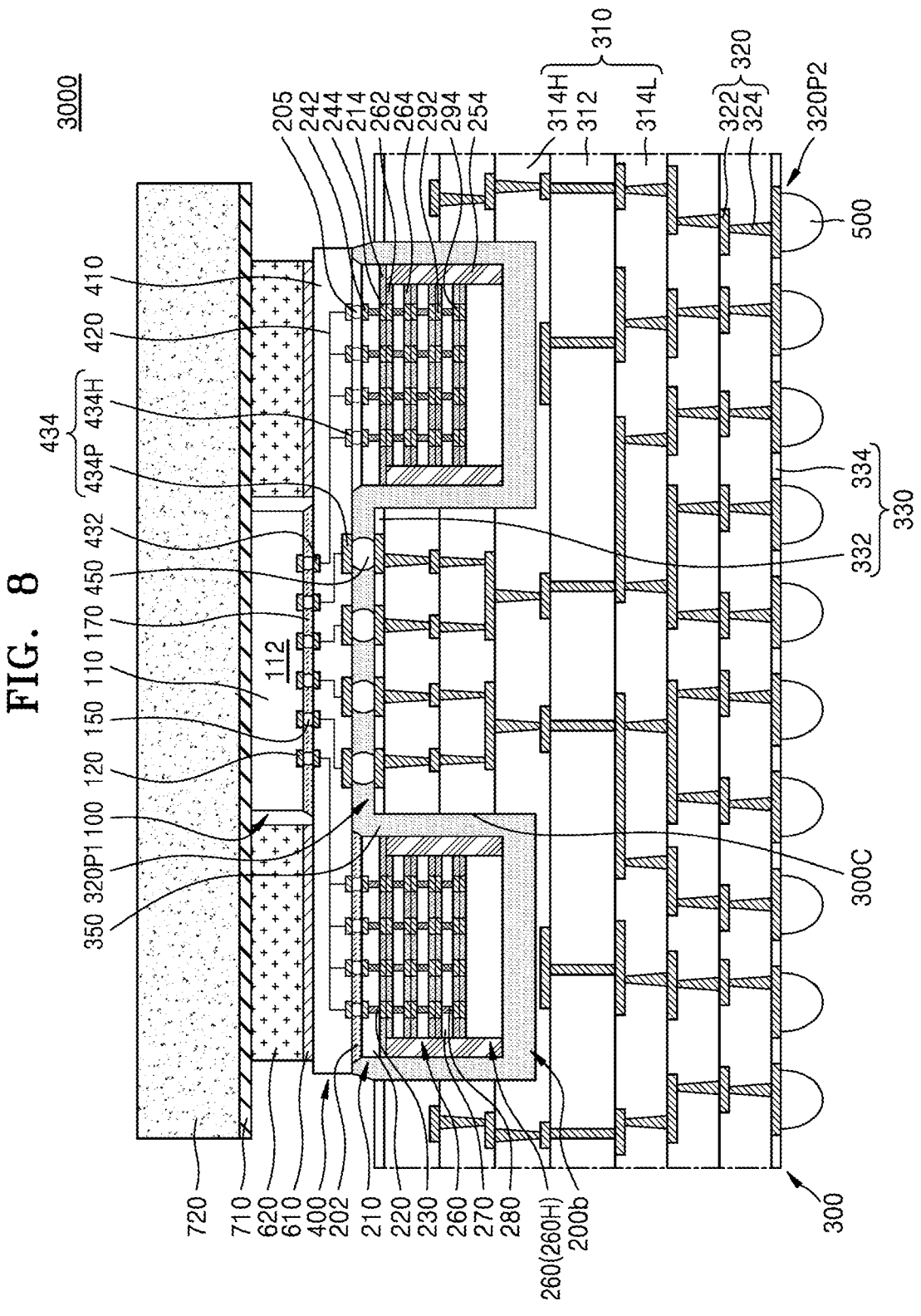
FIG. 8 is a cross-sectional view of a semiconductor package according to some embodiments.

FIG. 8 is a cross-sectional view of a semiconductor package according to some embodiments. In FIG. 8, the same reference numerals as those in FIG. 1 denote the same elements, and descriptions redundant with those of FIG. 1 may be omitted.

Referring to FIG. 8, a semiconductor package 3000 includes the package substrate 300, the wiring interposer 400 disposed on the package substrate 300, the at least one logic semiconductor chip 100 attached to the upper surface of the wiring interposer 400, and at least one memory semiconductor structure 200b attached to the lower surface of the wiring interposer 400.

The semiconductor package 3000 shown in FIG. 8 includes the at least one memory semiconductor structure 200b instead of the at least one memory semiconductor structure 200 included in the semiconductor package 1000 shown in FIG. 1.

The at least one memory semiconductor structure 200b may be a stacked structure including the first semiconductor chip 210 and the plurality of second semiconductor chips 260. A front surface cover insulating layer 262 may be disposed on the upper surface of the second semiconductor chip 260. A first rear surface cover insulating layer 214 may be disposed on the lower surface of the first semiconductor chip 210, and a second rear surface cover insulating layer 264 may be disposed on the lower surface of the second semiconductor chip 260. The front surface cover insulating layer 262 covering the upper surface of each of the plurality of second semiconductor chips 260 may surround a plurality of second front surface connection pads 292. The first rear surface cover insulating layer 214 covering the lower surface of the first semiconductor chip 210 may surround a plurality of first rear surface connection pads 244, and the second rear surface cover insulating layer 264 covering the lower surface of each of the plurality of second semiconductor chips 260 may surround a plurality of second rear surface connection pads 294.

The front surface cover insulating layer 262 and the first rear surface cover insulating layer 214 corresponding to each other, and the front surface cover insulating layer 262 and the second rear surface cover insulating layer 264 corresponding to each other may be bonded by forming a covalent bond. The plurality of second front surface connection pads 292 and the plurality of first rear surface connection pads 244 corresponding to each other, and the plurality of second front surface connection pads 292 and the plurality of second rear surface connection pads 294 corresponding to each other may be in contact with each other and bonded by diffusion bonding so as to be integral through diffusion of metal atoms contained therein, thereby achieving hybrid bonding.

FIG. 8 shows that the plurality of second interposer connection terminals 150 are disposed between the plurality of interposer upper surface pads 432 and the plurality of third front surface connection pads 120, and the plurality of first interposer connection terminals 205 are disposed between the plurality of interposer chip pads 434H and the plurality of first front surface connection pads 242, the embodiments are not limited thereto. For example, the plurality of interposer upper surface pads 432 and the plurality of third front surface connection pads 120 may be in contact with each other and bonded by diffusion bonding, thereby achieving hybrid bonding. For example, the plurality of interposer chip pads 434H and the plurality of first front surface connection pads 242 may be in contact with each other and bonded by diffusion bonding, thereby achieving hybrid bonding.

By way of summation and review, embodiments provide a semiconductor package including a plurality of semiconductor chips and having a reduced volume. That is, according to embodiments, a semiconductor package includes a semiconductor chip that generates the most heat (e.g., a buffer chip for controlling HBM DRAM), an interposer, a metal spacer, and a heat dissipation member that are stacked and overlap each other in a vertical direction. As such, a structure where the semiconductor chip that generates the most heat is closer to the heat dissipation member than underlying semiconductor chips (e.g., core chips), thereby facilitating heat dissipation from the semiconductor chip that generates the most heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a package substrate including a substrate cavity, the substrate cavity extending from an upper surface of the package substrate toward a lower surface of the package substrate;
   a wiring interposer attached to the package substrate;
   a memory semiconductor structure attached to a lower surface of the wiring interposer, at least a portion of the memory semiconductor structure being accommodated in the substrate cavity and a portion of the package substrate extending below the memory semiconductor structure;
   a logic semiconductor chip attached to an upper surface of the wiring interposer;
   a conductive spacer spaced apart from the logic semiconductor chip in a horizontal direction, the conductive spacer being attached to the upper surface of the wiring interposer and overlapping the memory semiconductor structure in a vertical direction; and
   a heat dissipation member over the logic semiconductor chip and the conductive spacer.

2. The semiconductor package as claimed in claim 1, wherein a depth of the substrate cavity, as measured between the upper surface of the package substrate and a bottom surface of the substrate cavity, is less than ½ of a thickness of the package substrate.

3. The semiconductor package as claimed in claim 1, wherein the memory semiconductor structure completely overlaps the conductive spacer in the vertical direction.

4. The semiconductor package as claimed in claim 1, wherein a part of the memory semiconductor structure overlaps the logic semiconductor chip in the vertical direction.

5. The semiconductor package as claimed in claim 1, wherein a first height, as measured from the lower surface of the wiring interposer to a lower surface of the memory semiconductor structure, is three or more times greater than a second height, as measured from the upper surface of the wiring interposer to an upper surface of the logic semiconductor chip.

6. The semiconductor package as claimed in claim 1, wherein:
   the wiring interposer includes interposer lower surface pads at the lower surface of the wiring interposer, interposer upper surface pads at the upper surface of the wiring interposer, and an interposer wiring layer electrically connecting between the interposer lower surface pads and the interposer upper surface pads, the interposer lower surface pads having interposer chip pads and interposer substrate pads,
   the memory semiconductor structure includes first front surface connection pads electrically connected to the interposer chip pads,
   the logic semiconductor chip includes second front surface connection pads electrically connected to the interposer upper surface pads, and
   the package substrate includes upper surface substrate pads electrically connected to the interposer substrate pads and positioned at a vertical level lower than the first front surface connection pads.

7. The semiconductor package as claimed in claim 6, wherein at least some of the first front surface connection pads overlap the logic semiconductor chip in the vertical direction.

8. The semiconductor package as claimed in claim 6, further comprising:
   first interposer connection terminals between the interposer chip pads and the first front surface connection pads; and
   second interposer connection terminals between the interposer substrate pads and the upper surface substrate pads, each of the second interposer connection terminals having a height greater than a height of each of the first interposer connection terminals.

9. The semiconductor package as claimed in claim 1, wherein the memory semiconductor structure includes:
   a high bandwidth dynamic random access memory having a buffer chip, and
   memory cell chips sequentially stacked on the lower surface of the wiring interposer.

10. A semiconductor package, comprising:

a package substrate including a substrate cavity, the substrate cavity extending from an upper surface of the package substrate toward a lower surface of the package substrate;

a wiring interposer attached to the package substrate;

a memory semiconductor structure attached to a lower surface of the wiring interposer, at least a portion of the memory semiconductor structure being accommodated in the substrate cavity;

a logic semiconductor chip attached to an upper surface of the wiring interposer, the logic semiconductor chip having a non-overlapping relationship with the substrate cavity in a vertical direction;

a conductive spacer spaced apart from the logic semiconductor chip in a horizontal direction, the conductive spacer being attached to the upper surface of the wiring interposer and completely overlapping the memory semiconductor structure in the vertical direction; and a heat dissipation member over the logic semiconductor chip and the conductive spacer.

11. The semiconductor package as claimed in claim 10, wherein:

the package substrate includes stacked base layers, wiring patterns on upper and lower surfaces of each of the base layers, and wiring vias penetrating at least one of the base layers and electrically connecting between some of the wiring patterns positioned at different vertical levels, the base layers include a core layer, an upper prepreg layer stacked on an upper surface of the core layer, and a lower prepreg layer stacked on a lower surface of the core layer, the substrate cavity penetrates at least a part of the upper prepreg layer, and a bottom surface of the substrate cavity is at a same vertical level as or at a higher vertical level than the upper surface of the core layer.

12. The semiconductor package as claimed in claim 11, wherein a thickness of each of the upper prepreg layer and the lower prepreg layer is less than a thickness of the core layer.

13. The semiconductor package as claimed in claim 12, wherein a depth of the substrate cavity, as measured between the upper surface of the package substrate and the bottom surface of the substrate cavity, is less than ½ of a thickness of the package substrate.

14. The semiconductor package as claimed in claim 11, wherein the part of the upper prepreg layer is exposed to the bottom surface of the substrate cavity positioned at a vertical level higher than the upper surface of the core layer.

15. The semiconductor package as claimed in claim 11, wherein the wiring patterns include a ground wiring pattern, the ground wiring pattern being connected to a ground and being exposed to the bottom surface of the substrate cavity.

16. The semiconductor package as claimed in claim 11, wherein a part of the core layer is exposed to the bottom surface of the substrate cavity.

17. The semiconductor package as claimed in claim 10, wherein a horizontal area of the heat dissipation member is larger than a total horizontal area of the logic semiconductor chip, the conductive spacer, and a space between the logic semiconductor chip and the conductive spacer.

18. The semiconductor package as claimed in claim 10, wherein the upper surface of the package substrate is at a vertical level lower than an upper surface of the memory semiconductor structure.

19. A semiconductor package, comprising:

a package substrate including a substrate cavity and upper surface substrate pads, the substrate cavity extending from an upper surface of the package substrate toward a lower surface of the package substrate, and the upper surface substrate pads being on the upper surface of the package substrate;

a wiring interposer attached onto the package substrate, the wiring interposer including:

interposer lower surface pads respectively having interposer chip pads and interposer substrate pads, the interposer lower surface pads being at a lower surface of the wiring interposer, interposer upper surface pads at an upper surface of the wiring interposer, and an interposer wiring layer electrically connecting the interposer lower surface pads to the interposer upper surface pads;

a memory semiconductor structure attached onto & the lower surface of the wiring interposer, at least a portion of the memory semiconductor structure being accommodated in the substrate cavity and including first front surface connection pads electrically connected to the interposer chip pads and positioned at a vertical level higher than the upper surface substrate pads;

a logic semiconductor chip attached onto the upper surface of the wiring interposer, the logic semiconductor chip including second front surface connection pads electrically connected to the interposer upper surface pads;

a conductive spacer spaced apart from the logic semiconductor chip in a horizontal direction, the conductive spacer being on the upper surface of the wiring interposer and overlapping the memory semiconductor structure in a vertical direction;

a heat dissipation member over the logic semiconductor chip and the conductive spacer;

interposer connection terminals between the interposer substrate pads and the upper surface substrate pads; and a filling under-fill layer filling the substrate cavity, the filling under-fill layer surrounding the interposer connection terminals and filling a space between the package substrate and the wiring interposer.

20. The semiconductor package as claimed in claim 19, wherein:

a depth of the substrate cavity, as measured between the upper surface of the package substrate and a bottom surface of the substrate cavity, is less than ½ of a thickness of the package substrate, and a first height, as measured from the lower surface of the wiring interposer to a lower surface of the memory semiconductor structure, is three or more times greater than a second height, as measured from the upper surface of the wiring interposer to an upper surface of the logic semiconductor chip.

* * * * *